US011543081B2

(12) United States Patent
Liu et al.

(10) Patent No.: US 11,543,081 B2
(45) Date of Patent: Jan. 3, 2023

(54) LED ASSEMBLY WITH OMNIDIRECTIONAL LIGHT FIELD

(71) Applicants: EPISTAR CORPORATION, Hsinchu (TW); KAISTAR LIGHTING (XIAMEN) CO., LTD., Xiamen (CN)

(72) Inventors: Hong-Zhi Liu, Yangmei (TW); Yi-Ting Kuo, Yangmei (TW); Tzu-Chi Cheng, Yangmei (TW)

(73) Assignees: EPISTAR CORPORATION, Hsinchu (TW); KAISTAR LIGHTING (XIAMEN) CO., LTD., Xiamen (CN)

( * ) Notice: Subject to any disclaimer, the term of this patent is extended or adjusted under 35 U.S.C. 154(b) by 33 days.

(21) Appl. No.: 17/091,938

(22) Filed: Nov. 6, 2020

(65) Prior Publication Data

US 2021/0054972 A1    Feb. 25, 2021

Related U.S. Application Data

(63) Continuation of application No. 14/309,828, filed on Jun. 19, 2014, now abandoned.

(30) Foreign Application Priority Data

Jun. 27, 2013 (TW) ................. 102122873
Mar. 27, 2014 (TW) ................. 103111887

(51) Int. Cl.
*F21V 9/00*        (2018.01)
*F21K 9/00*        (2016.01)
(Continued)

(52) U.S. Cl.
CPC ............... *F21K 9/00* (2013.01); *H01L 24/29* (2013.01); *F21K 9/232* (2016.08); *F21K 9/90* (2013.01);
(Continued)

(58) Field of Classification Search
CPC ........ F21K 9/00; F21K 9/232; F21Y 2103/10; F21Y 2107/00; F21Y 2115/10;
(Continued)

(56) References Cited

U.S. PATENT DOCUMENTS 5,924,784 A    7/1999  Chliwnyj et al.
8,143,634 B2   3/2012  Park et al.
(Continued)

FOREIGN PATENT DOCUMENTS

CN    101145594 A    3/2008
CN    202281057 U    6/2012
(Continued)

OTHER PUBLICATIONS

Machine translation of J P2008-251664, reference supplied by the Applicant in the Dec. 4, 2018 IDS (Year: 2008).

*Primary Examiner* — Omar Rojas Cadima
(74) *Attorney, Agent, or Firm* — Muncy, Geissler, Olds & Lowe, P.C.

(57) ABSTRACT

Disclosed is an LED assembly having an omnidirectional light field. The LED assembly has a transparent substrate with first and second surfaces facing to opposite orientations respectively. LED chips are mounted on the first surface and are electrically interconnected by a circuit. A transparent capsule with a phosphor dispersed therein is formed on the first surface and substantially encloses the circuit and the LED chips. First and second electrode plates are formed on the first or second surface, and electrically connected to the LED chips.

14 Claims, 17 Drawing Sheets

(51) Int. Cl.
*H01L 23/00* (2006.01)
*H01L 33/50* (2010.01)
*H01L 25/075* (2006.01)
*F21K 9/90* (2016.01)
*F21V 19/00* (2006.01)
*H05K 1/11* (2006.01)
*H05K 3/28* (2006.01)
*H05K 3/32* (2006.01)
*H05K 3/34* (2006.01)
*H05K 3/36* (2006.01)
*F21K 9/232* (2016.01)
*F21Y 103/10* (2016.01)
*F21Y 115/10* (2016.01)
*F21Y 107/00* (2016.01)

(52) U.S. Cl.
CPC ......... *F21V 19/003* (2013.01); *F21Y 2103/10* (2016.08); *F21Y 2107/00* (2016.08); *F21Y 2115/10* (2016.08); *H01L 24/32* (2013.01); *H01L 24/48* (2013.01); *H01L 24/49* (2013.01); *H01L 24/73* (2013.01); *H01L 25/0753* (2013.01); *H01L 33/50* (2013.01); *H01L 2224/2929* (2013.01); *H01L 2224/29386* (2013.01); *H01L 2224/29393* (2013.01); *H01L 2224/32225* (2013.01); *H01L 2224/48091* (2013.01); *H01L 2224/48137* (2013.01); *H01L 2224/48227* (2013.01); *H01L 2224/48464* (2013.01); *H01L 2224/49109* (2013.01); *H01L 2224/73265* (2013.01); *H01L 2924/00014* (2013.01); *H01L 2924/12032* (2013.01); *H01L 2924/12035* (2013.01); *H01L 2924/12036* (2013.01); *H01L 2924/12041* (2013.01); *H01L 2924/12042* (2013.01); *H01L 2924/181* (2013.01); *H05K 1/117* (2013.01); *H05K 3/285* (2013.01); *H05K 3/326* (2013.01); *H05K 3/3405* (2013.01); *H05K 3/366* (2013.01); *H05K 2201/09481* (2013.01); *H05K 2201/10674* (2013.01)

(58) Field of Classification Search
CPC ............. F21Y 2101/00; F21Y 2107/50; H01L 2924/12032; H01L 2924/12035; H01L 2924/12036; H01L 2924/12041; H01L 2924/12042; H01L 2224/48137; H01L 24/73; H01L 2224/2929; H01L 2224/29386; H01L 2224/29393; H01L 2224/32225; H01L 2224/48227; H01L 2224/48464; H01L 33/50; H01L 2924/181; H01L 33/62; H01L 2224/73265; F21V 19/003; F21V 19/001; H05K 3/326; H05K 3/3405; H05K 1/117; H05K 2201/09481
See application file for complete search history.

(56) References Cited

U.S. PATENT DOCUMENTS

| | | |
|---|---|---|
| 2005/0040511 A1 | 2/2005 | Kinsman |
| 2006/0261364 A1 | 11/2006 | Suehiro et al. |
| 2007/0139949 A1 | 6/2007 | Tanda et al. |
| 2009/0258515 A1 | 10/2009 | Masuda |
| 2011/0084299 A1 | 4/2011 | Kotani et al. |
| 2011/0147776 A1 | 6/2011 | Hikosaka et al. |
| 2011/0163681 A1 | 7/2011 | Dau et al. |
| 2012/0069543 A1 | 3/2012 | Chen |
| 2012/0217862 A1 * | 8/2012 | Matsuda ................ F21K 9/232 313/46 |
| 2012/0248469 A1 | 10/2012 | Choi |
| 2013/0147348 A1 | 6/2013 | Motoya et al. |
| 2013/0214247 A1 | 8/2013 | Hu |

FOREIGN PATENT DOCUMENTS

| | | | |
|---|---|---|---|
| CN | 103069593 A | 4/2013 | |
| EP | 2660887 A1 | 11/2013 | |
| JP | 2001-024238 A | 1/2001 | |
| JP | 2002-280615 A | 9/2002 | |
| JP | 2008-251664 A | 10/2008 | |
| JP | 2009-267289 A | 11/2009 | |
| JP | 2012-099726 A | 5/2012 | |
| JP | 2013-165228 A | 8/2013 | |
| TW | M455263 U | 6/2013 | |
| WO | WO-2012060106 A1 * | 5/2012 | ............. F21K 9/232 |
| WO | WO-2012/095931 A1 | 7/2012 | |
| WO | WO-2014041721 A1 * | 3/2014 | ........... F21K 9/1355 |

* cited by examiner

LED ASSEMBLY WITH OMNIDIRECTIONAL LIGHT FIELD

CROSS REFERENCE TO RELATED APPLICATIONS

This application is a Continuation of co-pending application Ser. No. 14/309,828, filed on Jun. 19, 2014, for which priority is claimed under 35 U.S.C. § 120; and this application claims priority of Application No. 102122873 filed in Taiwan on Jun. 27, 2013 and Application No. 103111887 filed in Taiwan on Mar. 27, 2014 under 35 U.S.C. § 119; the entire contents of all of which are hereby incorporated by reference in their entirety.

BACKGROUND

The present disclosure relates generally to light emitting diode (LED) assemblies, and more specifically, to LED assembly that has an omnidirectional light field.

LED has been used in different kinds of appliances in our daily life, such as traffic lights, car headlights, street lamps, computer indicators, flash lights, LCD backlight modules, and so on. Beside the semiconductor manufacturing process in the front end, the LED chips used in these appliances should go through LED packaging in the back end.

LED packaging mainly provides mechanical, electrical, thermal, and optical supports to LED chips. LED chips, which are a kind of semiconductor products, are prone to performance degradation, or aging, if exposed for a long time in an atmosphere full of humidity or chemical. Epoxy resin is commonly used in LED packaging to cover or seal LED chips, such that LED chips are effectively isolated from detrimental atmosphere. Furthermore, LED packaging should take heat dissipation and luminance extraction into consideration, in order to make LED assembly more power-saving and reliable. Heat generated in an LED chip must be dissipated efficiently. Otherwise, heat accumulated in the PN junction of an LED chip will damage or degrade its performance, shortening its lifespan. Optical design is also a key factor when designing of LED packaging. Light emitted from an LED chip must be transmitted in a way that results in certain luminance distribution with certain intensity.

The design for packaging a white LED further needs to consider color temperature, color rendering index, phosphor, etc. The white LED could be provided by phosphor converting a portion of blue light from a blue LED chip into green/yellow light such that the mixture of the lights is perceived as white light by human eyes. Because human eyes are vulnerable to high-intensity blue light, the blue light from a blue LED chip in a white LED package should not go outside directly without its intensity being attenuated. In other words, the blue light should be kind of "sealed" or "capsulated" so as to prevent blue light leakage to human eyes.

In order to make products more competitive in the market, LED package manufactures constantly pursue packaging processes which are reliable, low-cost, and high-yield.

SUMMARY OF THE DISCLOSURE

The present disclosure provides a light emitting diode assembly.

The light emitting diode assembly comprises a transparent substrate, comprising first and second surfaces facing to opposite orientations respectively; light emitting diode chips, mounted on the first surface; a circuit electrically connecting the light emitting diode chips; a transparent capsule with a phosphor dispersed therein, formed on the first surface and substantially enclosing the circuit and the light emitting diode chips; and first and second electrode plates, formed on the first or second surface, and electrically connected to the light emitting diode chips.

BRIEF DESCRIPTION OF THE DRAWINGS

Non-limiting and non-exhaustive embodiments of the present disclosure are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The disclosure can be more fully understood by the subsequent detailed description and examples with references made to the accompanying drawings, wherein.

DETAILED DESCRIPTION

Figure 1:
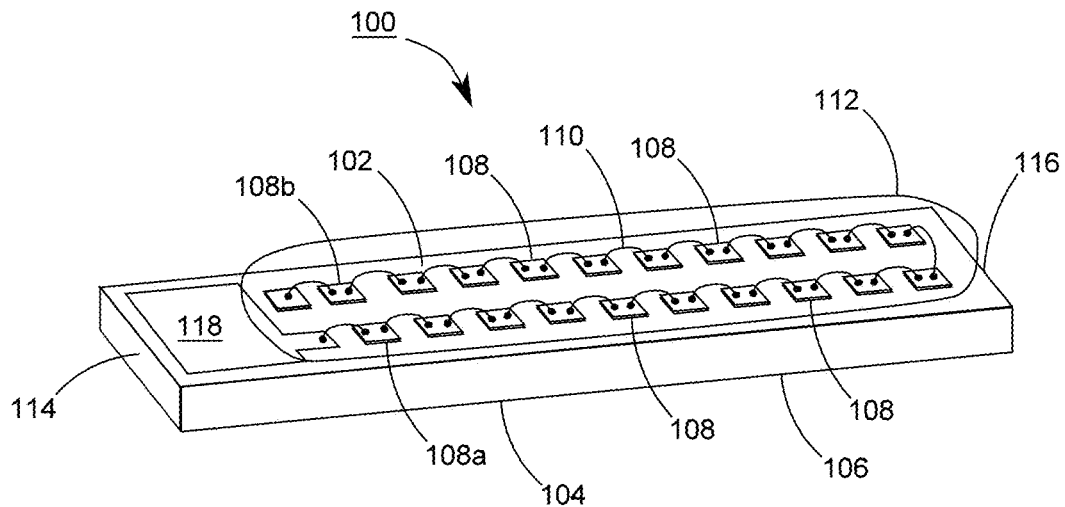
FIG. 1 illustrates an LED assembly according to embodiments of the disclosure.

An LED assembly 100 according to an embodiment of the disclosure is described in detail with reference to FIG. 1. The LED assembly 100 has a transparent substrate 106, which is for example an electrically non-conductive glass. The transparent substrate 106 has a top surface 102 and a bottom surface 104 facing to opposite orientations respectively. As shown in FIG. 1, the transparent substrate 106 is substantially in the form of a thin and longitudinal strip with two ends 114 and 116. In this specification, the term, transparent, only means admitting the passage of light and could also be referred to as translucent or semitransparent. Objects situated behind a transparent material in this specification might be distinctly or indistinctly seen. In other embodiments, the transparent substrate 106 is sapphire, ceramic material (ex. $Al_2O_3$ or AlN), silicon carbide (SiC), or diamond-like carbon (DLC). It is noted that the transparent substrate 106 can contain a plurality of thermal-conduction particles or other components for reducing process temperature during its manufacturing process.

Figure 2A:
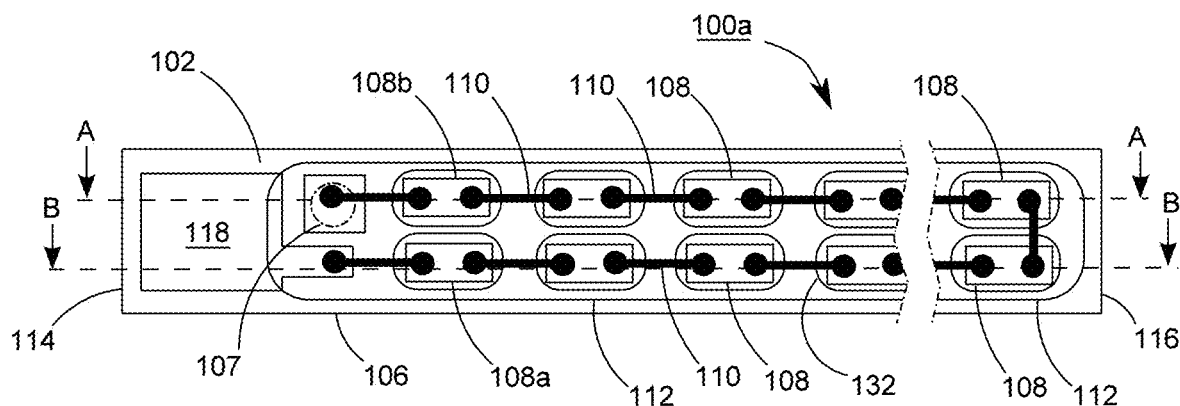
FIG. 2A demonstrates a top view of the LED assembly in FIG. 1.

FIG. 2A demonstrates a top view of an LED assembly 100a, which exemplifies the LED assembly 100 in one embodiment. Mounted on the top surface 102 are several blue LED chips 108 electrically connected to each other through a circuit mainly composed of bonding wires 110, which provide interconnection to the blue LED chips 108. Each blue LED chip 108 could have only one single LED cell, whose forward voltage is about 2 to 3 volts, and this kind of LED chip is referred to as a low-voltage LED chip hereinafter. Comparatively, each blue LED chip 108 might include several LED cells connected in series, and is referred to as a high-voltage LED chip hereinafter, because its forward voltage could be as high as 12V, 24V, or 48V, much higher than that of a low-voltage LED chip. In one embodiment, each LED cell has a light-emitting layer in a diode formed on a substrate, which could be an epitaxial or non-epitaxial substrate. More specifically, the LED cells in a high-voltage LED chip are electrically connected to each other on a common substrate, not by wire bonding but by some patterned conductive strips produced by semiconductor processes, such as metallization or lithography that processes all the LED cells at the same time. In FIG. 1 and FIG. 2A, the blue LED chips 108 are arranged in two rows beside a longitudinal line that links two ends 114 and 116 of the transparent substrate 106. The bonding wires 110 electrically connect the blue LED chips 108 in series, generating an equivalent LED device with a high forward voltage. The blue LED chips 108 are not limited to connect in series and arrange in two rows though. In some other embodiments, the blue LED chips 108 might be arranged to any kind of patterns and could be electrically connected in series, in parallel, in series-parallel, in bridge or in the combination thereof.

As shown in FIG. 2A, the transparent substrate 106 has a conductive via 107 close to the end 114. The conductive via 107 has a via hole tunneling through the transparent substrate 106 and the via hole is formed with electrically-conductive material filled therein or coated on its sidewall, so as that the conductive via 107 is capable of coupling or connecting an electric component on the top surface 102 to another on the bottom surface 104. Nearby the end 114 has a conductive electrode plate 118 on the top surface 102. The conductive electrode plate 118 locates between the end 114 and the conductive via 107. The conductive electrode plate 118 does not directly contact with conductive via 107. One of the blue LED chips 108, specifically labeled as 108a in FIG. 2A, is close to the end 114 and has a bonding wire 110 thereon to electrically connect to the electrode plate 118. Another blue LED chip 108b, which is close to the end 114, is electrically connected to the conductive via 107 by another bonding wire 110.

All the blue LED chips 108 and all the bonding wires 110 on the top surface 102 are covered by a transparent body 112 to prevent moisture or chemical in atmosphere from damaging or aging the blue LED chips 108 or the bonding wires 110. The transparent body 112 is epoxy resin or silicone, for example. Dispersed in the transparent body 112 is at least one kind of phosphor that is capable of converting portion of the blue light from blue LED chips 108 (having a peak wavelength about 430 nm to 480 nm) into yellow light (having a peak wavelength from about 570 nm to 590 nm) or yellowish green light (having a peak wavelength about 540 nm to 570 nm), such that human eyes perceive white light from the mixture. In one embodiment, the transparent body 112 comprises two kinds of phosphors dispersed therein. One of the phosphors is capable of converting portion of the blue light from blue LED chips 108 into yellow light or yellowish green light or green (having a peak wavelength from about 520 nm to 590 nm) and the other of the phosphors is capable of converting portion of the blue light from blue LED chips 108 into red light (having a peak wavelength from about 610 nm to 680 nm). FIG. 1 is illustrative to show blue LED chips 108 and bonding wires 110 clearly visible under transparent body 112. In one embodiment, as aforementioned, the term, transparent, only means admitting the passage of light and could also be referred to as translucent or semitransparent. Therefore, the transparent body 112 can be translucent or semitransparent such that the LED chips 108 and the bonding wires 110 could be distinctly or indistinctly seen behind the transparent body 112. In another embodiment, the LED chips 108 and the bonding wires 110 could be invisible because of the phosphor dispersed inside the transparent body 112 and the transparent body 112 appears the color of the phosphor dispersed therein.

Figure 2B:
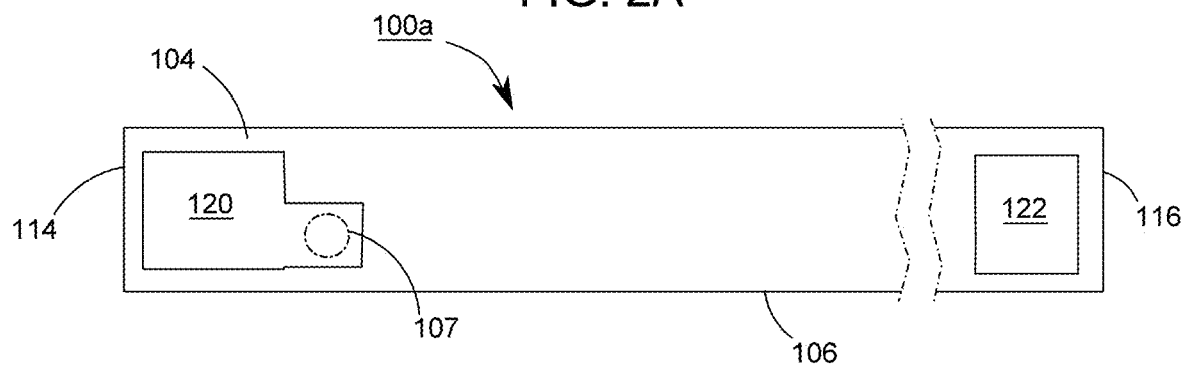
FIG. 2B demonstrates a bottom view of the LED assembly in FIG. 1.

FIG. 2B demonstrates a bottom view of the LED assembly 100a. As shown in FIG. 2B, no blue LED chips are mounted on the bottom surface 104. Formed on the bottom surface 104 nearby the end 114 is another electrode plate 120, which electrically connects to the conductive via 107. In one embodiment, the electrode plate 120 geometrically overlaps and physically contacts with the conductive via 107. In another embodiment, the conductive via 107 and the electrode plate 120 do not overlap, and a conductive device, such as a bonding wire or a metal strip, is located therebetween to electrically connect them to each other. FIG. 2B also shows an optional electrode plate 122 formed on the bottom surface 104 nearby the end 116. This kind of design could have the electrode plates 122 and 120 coplanar, and therefore the LED assembly 100a, during handling or transportation, could be steadier to avoid flipping or falling. The electrode plate 122 electrically floats in this embodiment. In other words, the electrode plate 122 does not electrically couple or connect to any electric devices or elements in the LED assembly 100a. When the LED assembly 100a is laid on a planar surface, the electrode plate 122 helps stabilize the LED assembly 100a.

The embodiment shown in FIGS. 2A and 2B has the electrode plates 120 and 118 located completely within the top surface 102 or the bottom surface 104 as the electrode plates 120 and 118 do not extend across the edges of the top surface 102 and the bottom surface 104. The electrode plates 120 and 118 are not required to be rectangular or to have the same size. For example, one of the electrode plates 120 and 118 could be about rectangular, indicating a cathode of the LED assembly 100a, while the other is about spherical, indicating an anode of the LED assembly 100a.

In view of electric connection, the blue LED chips 108 and the conductive via 107 are connected in series between the electrode plates 120 and 118, which are two power input nodes for powering the LED assembly 100a. A conventional power supply (not shown) would have two power output terminals respectively contacting the electrode plates 120 and 118 to drive and illuminate the blue LED chips 108.

Figure 3A:
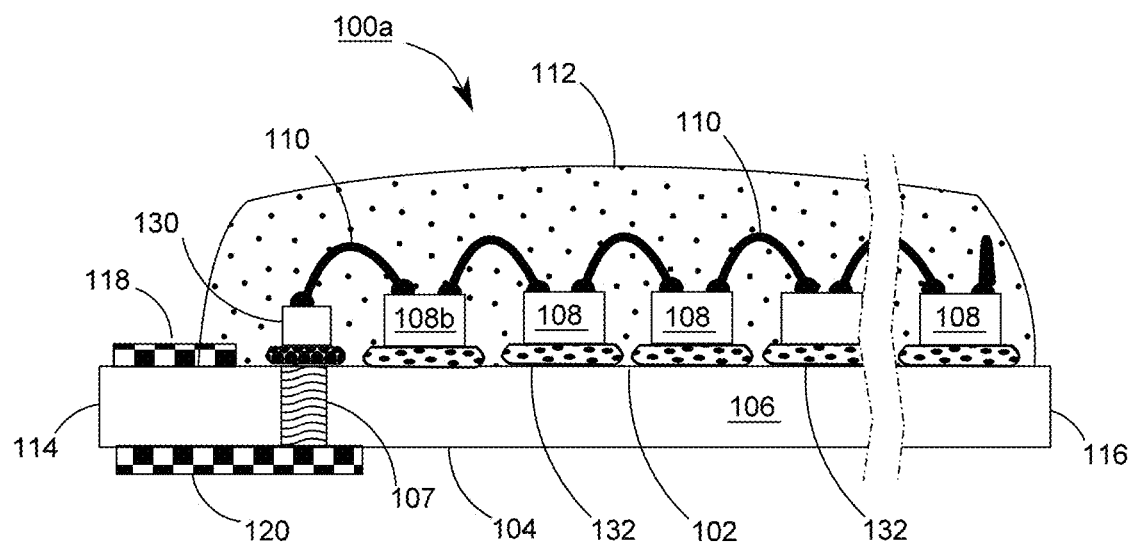
FIG. 3A demonstrates a cross-sectional view of the LED assembly in FIG. 2A along line AA, and FIG. 3B demonstrates that along line BB.
Figure 3B:
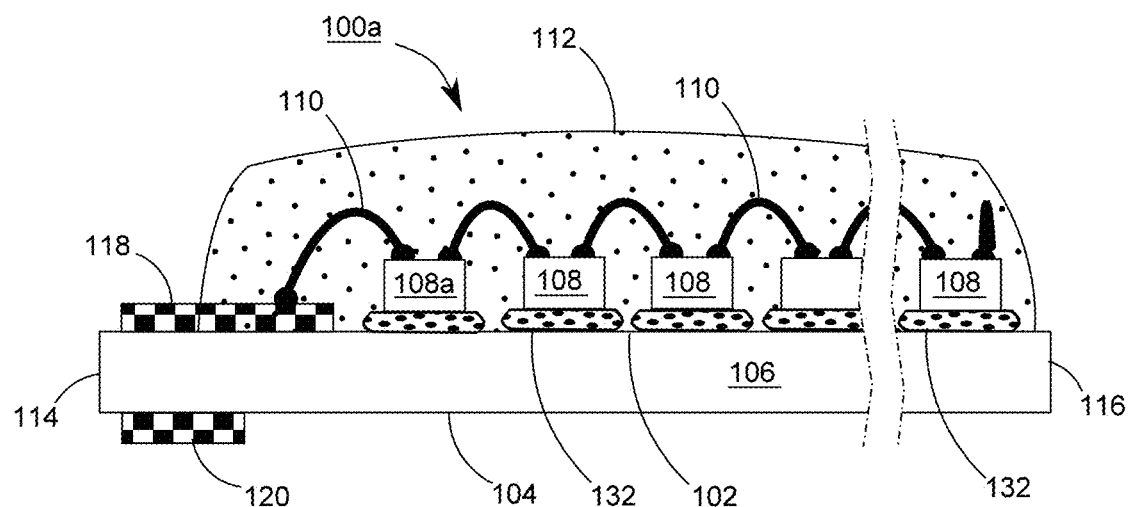

FIG. 3A demonstrates a cross-sectional view of the LED assembly 100a in FIG. 2A along line AA, and FIG. 3B demonstrates that along line BB.

Figure 4:
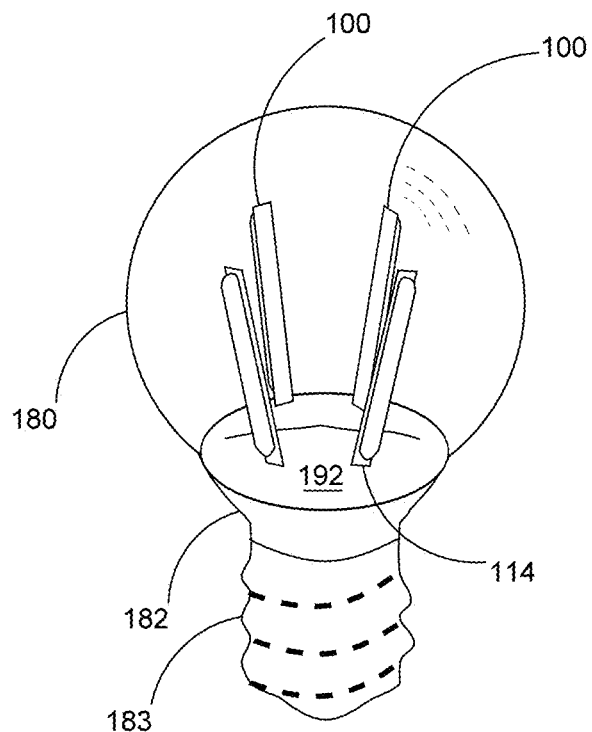
FIG. 4 shows a light bulb using several LED assemblies assembled therein as its lighting sources.
Figure 5A:
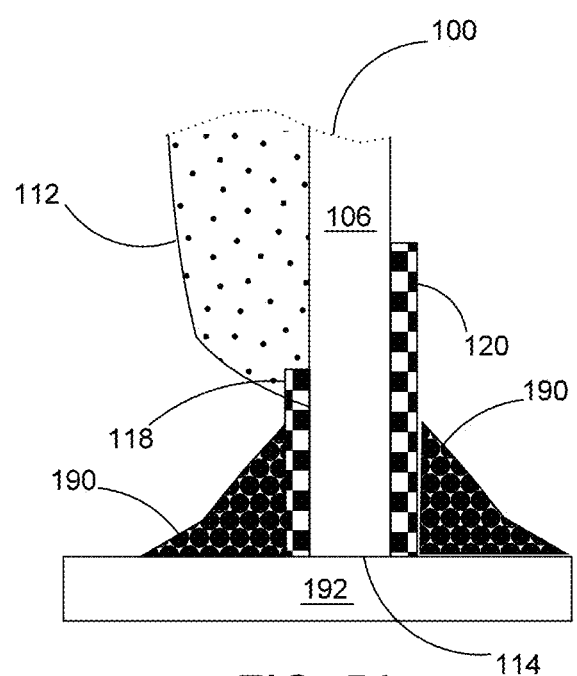
FIG. 5A demonstrates that the LED assembly is fixed on a circuit board by solder joints.
Figure 5B:
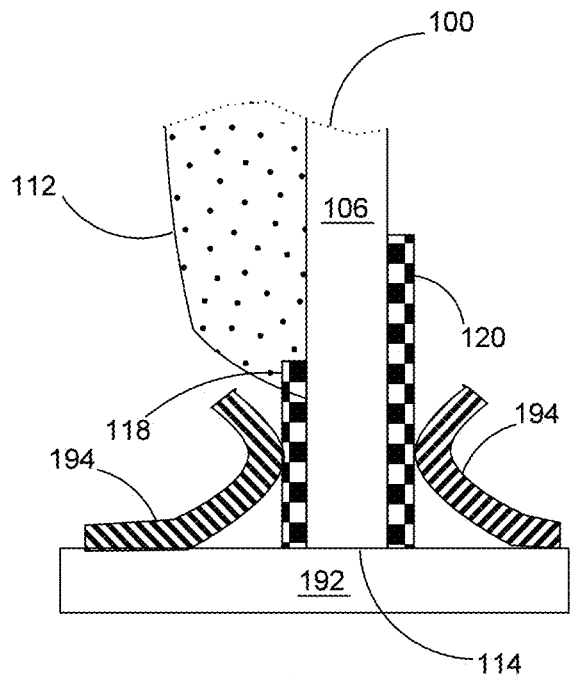
FIG. 5B demonstrates a clamp with two metal jaws to grasp and hold one LED assembly vertically on a circuit board.

Shown in FIG. 3A, a bonding wire 110 connects the blue LED chip 108b to the conductive via 107, which in turn connects to the electrode plate 120 on the bottom surface 104. In FIG. 3B, another bonding wire 110 connects the blue LED chip 108a to the electrode plate 118. FIG. 4 shows a light bulb using several LED assemblies 100 as its lighting sources. The light bulb in FIG. 4 includes a lamp shell 180, the LED assemblies 100, a circuit board 192, a heat dissipation apparatus 182 and an electrical connection structure 183. The end 114 of each LED assembly 100 fixes on the circuit board 192, which firmly mounts on the heat dissipation apparatus 182 such that the heat generated by the LED assembly 100 could be dissipated efficiently. The heat dissipation apparatus 182 stays firmly on the electrical connection structure 183, which is for example an Edison screw base capable of screwing into a matching socket. As both electrode plates 120 and 118 are nearby a common end 114 of the transparent substrate 106 in one LED assembly 100 but locate on opposite surfaces, electrically-conductive blocks, such as solder joints 190, can electrically connect the electrode plates 120 and 118 to two different terminals on the circuit board 192, respectively, as shown in FIG. 5A. Beside the electrical connection, the solder joints 190 also provide mechanical support to the end 114, to hold the LED assembly 100 up straight on the circuit board 192, so the LED assembly 100, if illuminating, could generate an omnidirectional light field to its surrounding. In FIG. 5A, one LED assembly 100 stands, but is not limited to stand, almost vertically, only by way of the mechanical support provided by the solder joints 190, which also transmit any necessary electric power from the circuit board 192 to the LED assembly 100. FIG. 5B demonstrates a clamp with two metal jaws 194 to grasp and hold one LED assembly 100 vertically on the circuit board 192. The metal jaws 194 provide both electrical connection and mechanical support to one LED assembly 100, simplifying the manufacture processes required to secure the LED assembly 100 on the circuit board 192. In some embodiments, an LED assembly 100 stands on the circuit board 192 with a sloping position.

Exemplified in FIG. 3A is a vertically-conducting device 130 placed on the top surface 102 above the conductive via 107. The vertically-conductive device 130 conducts current vertically, and is by way of examples a PN junction diode (such as a vertical-type light-emitting diode, a schottky diode or a zener diode), a resistor, or simply a metal ingot, adhering on the conductive via 107 via a conductive silver paste. In another embodiment, the vertically-conducting device 130 and the conductive silver paste demonstrated in FIG. 3A could be omitted and a bonding wire 110 bonding on both the conductive via 107 and the blue LED chip 108b provides necessary electric connection.

In both non-limiting FIGS. 3A and 3B, each blue LED chip 108 has a transparent adhesive layer 132 thereunder, each adhering only one corresponding blue LED chip 108 on the top surface 102 of the transparent substrate 106. In another embodiment, there are several transparent adhesive layers 132 on the top surface 102, and at least one of the adhesive layers carries several blue LED chips 108. In another embodiment, there is only one single transparent adhesive layer 132 to adhere all blue LED chips 108 to the top surface 102. Tradeoff occurs to the area size of one transparent adhesive layer 132. The larger the area of a transparent adhesive layer 132, the more effective the heat dissipation that the transparent adhesive layer 132 provides to the blue LED chips 108 thereabove, in expense of the more shear stress due to the difference in thermal expansion coefficients of the transparent adhesive layer 132 and the transparent substrate 106. Accordingly, the design of both the area size of one transparent adhesive layer 132 and the number of the blue LED chips 132 carried on by one transparent adhesive layer 132 depends on actual applications and might vary. In some embodiments, some particles with excellent thermal conductivity, such as alumina powder, diamond-like carbon, or silicon carbide, whose thermal conductivity is more than 20 W/mK, are dispersed in one transparent adhesive layer 132. These particles help not only dissipate heat, but also scatter the light from the blue LED chips 108.

The transparent adhesive layers 132 could be epoxy resin or silicone, and mix with phosphor similar with or different from that of the transparent body 112. The phosphor is, for example, yttrium aluminum garnet (YAG) or terbium aluminum garnet (TAG). As mentioned, the transparent body 112 with phosphor covers above and surrounds each blue LED chip 108 while the transparent adhesive layers 132 locates under each blue LED chips 108. The transparent body 112 and the transparent adhesive layers 132 sandwich blue LED chips 108. In other words, the transparent body 112 and the transparent adhesive layers 132 together as a whole become a kind of transparent capsule that encloses all blue LED chips 108, but leaves a portion of electrode plate 118 exposed for external electric connection. The blue or UV light from any blue LED chip 108 inevitably experiences conversion, so that human eyes could avoid damage or stress caused by over high intensity of the blue or UV light.

A manufacturing process for producing the LED assembly 100a of FIGS. 3A and 3B is described in detail with reference to FIG. 6. In Step 148, a transparent substrate 106 is provided with a conductive via 107 formed in advance. For example, a laser beam could be used to melt a small area of the transparent substrate 106 so as to form a via hole on the transparent substrate 106. An electrically-conductive material could fill in the via hole or be coated on the via hole to form the conductive via 107. In Step 150, the transparent substrate 106 is pre-cut, forming some trenches or grooves thereon, which geometrically partition LED assemblies 100 that are formed and separated in the end. In Step 152, electrode plates 118 and 120 are attached respectively on top and bottom surfaces (102, 104) of the transparent substrate 106, both nearby the end 114. In case that an electrode plate 112 is expected, it is formed nearby the end 116 in step 152. For example, electrode plates would be formed by screen printing and/or lift-off process, to generate specific conductive patterns on the top and bottom surfaces (102, 104) of the transparent substrate 106. In Step 154, one or more transparent adhesive layers 132 with phosphor is formed on the top surface 102 by gluing, printing, spraying, dispensing, or coating, for example.

In Step 155, blue LED chips 108 are mounted on the transparent adhesive layers 132. A vacuum nuzzle, for example, picks up blue LED chips 108 one by one and then put them to adhere on to specific locations of the transparent adhesive layers 132. In reference to a top view of an LED assembly, preferably each blue LED chip 108 is completely surrounded by the periphery of one transparent adhesive layer 132, so as to form a phosphor capsule in the end to totally seal a blue LED chip 108 therein. In other words, the transparent adhesive layer 132 has a flat area larger than the total area of all blue LED chips 108, so as to completely cover the backsides of all blue LED chips 108. Meanwhile, a silver paste can be used to attach a vertically-conductive device 130 on the top surface 102 and adhere it to the conductive via 107. Bonding wires 110 are formed in step 156, to provide an electric connection between every two blue LED chips 108, between the blue LED chip 108a and the electrode plate 118, and between the blue LED chip 108b and the vertically-conductive device 130. In Step 157, a transparent body 112 with phosphor is formed on the top surface 102, to encapsulate the bonding wires 110 and the blue LED chips 108, by way of dispensing or screen printing. In Step 158, a singulation process is performed, where the transparent substrate 106 is cut to form a plurality of individual LED assemblies 100, by way of saw cutting along the previously-formed trenches or grooves for example.

Figure 6:
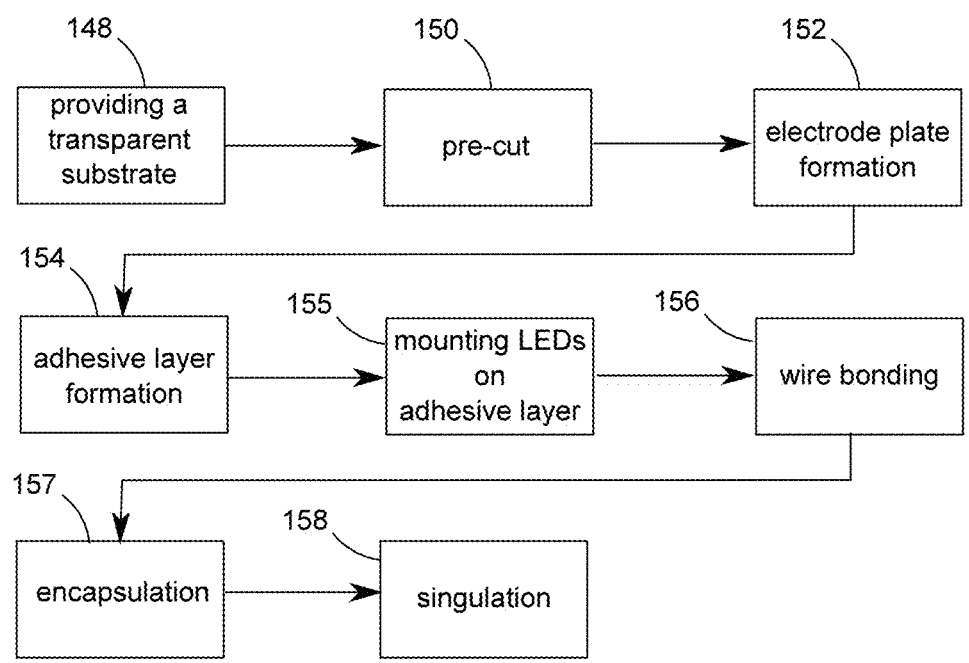
FIG. 6 illustrates a manufacturing process for producing the LED assembly of FIGS. 3A and 3B.

It can be derived from FIG. 6 that, in step 152, the electrode plates 120 or 122 are formed on the bottom surface 104. However, in step 154-157, all the transparent adhesive layer 132, the LED chips 108, the bonding wires 110 and the transparent body 112 are formed on the top surface 102. Therefore, only large patterns like the electrode plates 120 and 122 are formed on the bottom surface 104, which are immune from casual tiny scratches. In addition, holders, carriers, or robot arms for transporting or holding the transparent substrate 106 could physically contact the bottom surface 104 to avoid any damage to the fine patterned structures on the top surface 102, such that yield improvement is foreseeable.

Embodiments exemplified in FIGS. 3A, 3B, and 6 do not restrain the direction where the light from a blue LED chip 108 goes. The light from a blue LED chip 108 could go downward through the transparent adhesive layer 132 and the transparent substrate 106 to provide light that appears white. The light from a blue LED chip 108 could go upward or vertically through the transparent body 112 to provide white light as well. Therefore, the LED assembly 100a is a lighting device that has an omnidirectional white light field. As the lamp in FIG. 4 uses the LED assemblies 100 as its light resources, it could be an omnidirectional white lighting apparatus, which is possible to replace a traditional incandescent lamp.

Figure 7A:
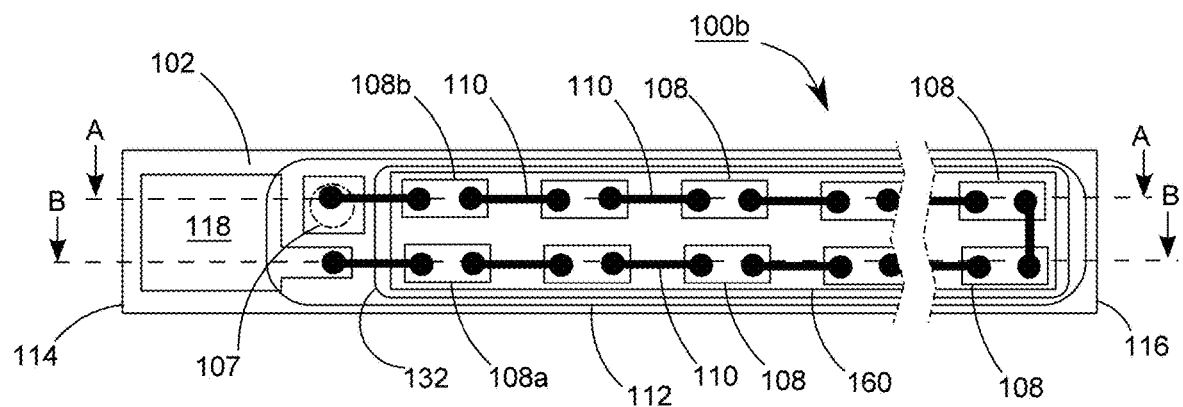
FIGS. 7A and 7B demonstrate top and bottom views of an LED assembly respectively, according to embodiments of the disclosure.
Figure 7B:
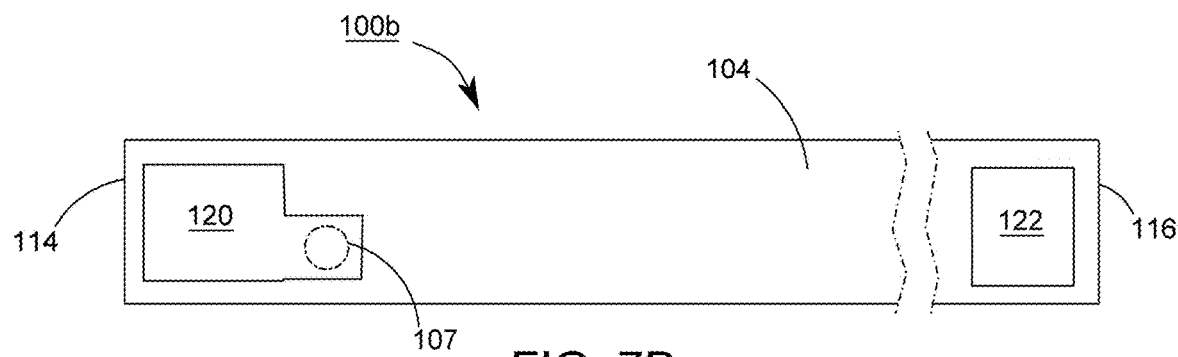
Figure 8A:
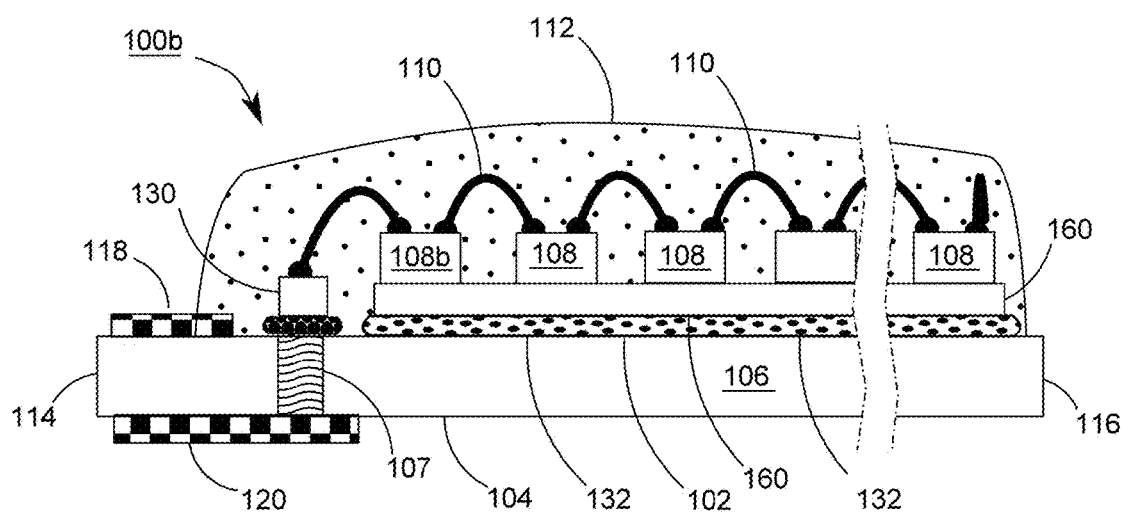
FIGS. 8A and 8B show two cross-sectional views of the LED assembly in FIG. 7A along line AA and line BB.
Figure 8B:
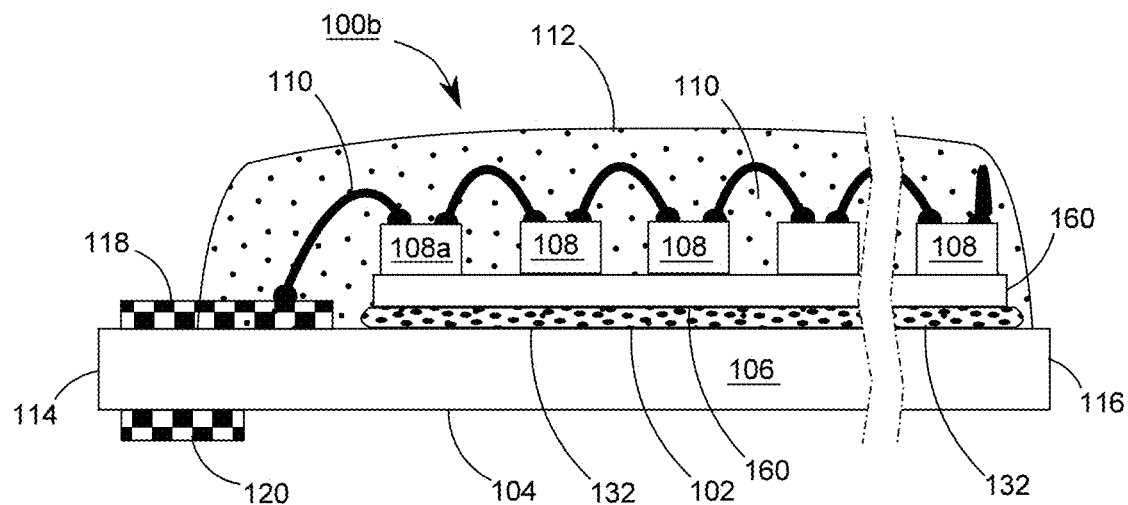

In FIGS. 2A, 2B, 3A and 3B, the blue LED chips 108 mounted directly on the transparent substrate 106 only through the transparent adhesive layers 132, but this disclosure is not limited to. FIGS. 7A and 7B demonstrate top and bottom views of an LED assembly 100b respectively, according to one embodiment of the disclosure. Two cross-sectional views of the LED assembly 100b are shown in FIGS. 8A and 8B, and a manufacturing method to produce the LED assembly 100b is exemplified in FIG. 9. FIGS. 7A, 7B, 8A, 8B and 9 correspond to FIGS. 2A, 2B, 3A, 3B, and 6, where devices, elements or steps with similar or the same symbols represent those with the same or similar functions and could be omitted in the following explanation for brevity.

Different from FIG. 2A, FIG. 7A additionally includes a submount 160 positioning inside the periphery of a transparent adhesive layer 132 (from the perspective of a top view) and sandwiched between the transparent adhesive layer 132 and the blue LED chips 108. Submount 160 could be glass, sapphire, SiC, or diamond-like carbon. Unlike FIGS. 3A and 3B, all or a portion of blue LED chips in FIGS. 8A and 8B are mounted on the submount 160, which is adhered onto the transparent substrate 106 through the transparent adhesive layer 132.

Figure 9:
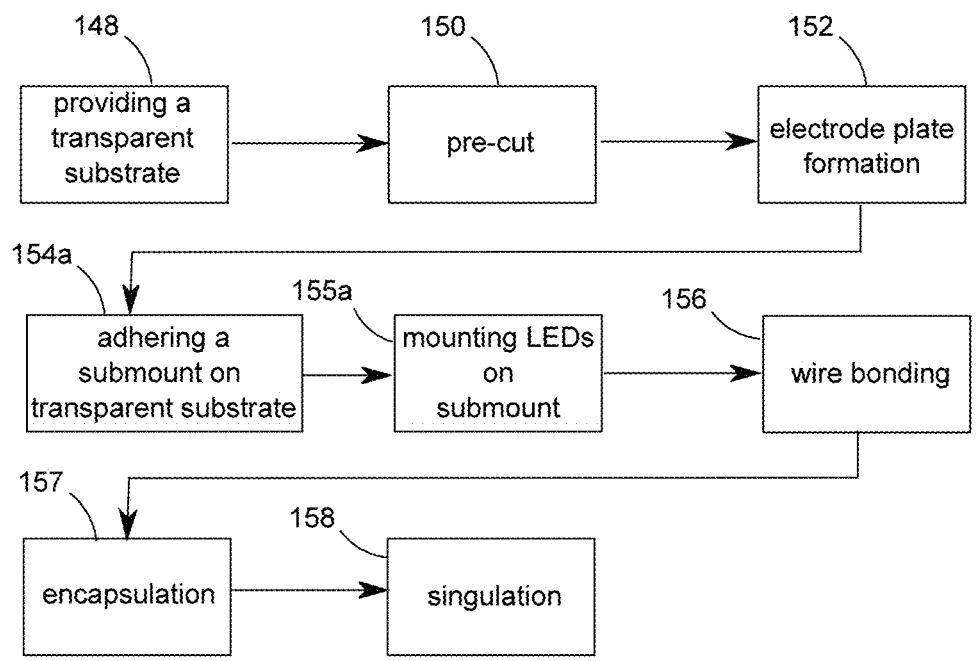
FIG. 9 exemplifies a manufacturing method to produce an LED assembly.

FIG. 9 uses steps 154a and 155a to replace steps 154 and 155 in FIG. 6. In Step 154a, the submount 160 is fixed on the transparent substrate 106 using the transparent adhesive layer 132 with phosphor. In one embodiment, the transparent adhesive layer 132 first adheres to the backside of the submount 160, followed by attaching the submount 160 on the transparent substrate 106. In another embodiment, the transparent adhesive layer 132 first adheres to the top surface 102 of the transparent substrate 106 and the submount 160 is then attached over the transparent adhesive layer 132. In Step 155a, the blue LED chips 108 are mounted on the submount 160.

The blue LED chips 108 in FIGS. 7A, 7B, 8A, 8B, and 9 could be mounted on the submount 160 using the material the same or similar with that of the transparent adhesive layer 132, but the disclosure is not limited to. Eutectic alloy or transparent glue without phosphor could be used to attach the blue LED chips 108 onto the submount 160. In one embodiment, the top surface of the submount 160 has patterned conductive strips, over which the blue LED chips 108 are mounted by way of flip chip technique. As known in the art, flip chip technique, which has semiconductor chips facing downward on interconnection metal strips for example, needs no bonding wires shown in step 156 in FIG. 9 might be skipped. Nevertheless, the bonding wires 100 or the silver paste might be used in some embodiments for electrically connecting the blue LED chip 108b to the conductive via 107, or the blue LED chip 108a to the electrode plate 118. In one embodiment, an anisotropic conductive polymer (ACP) or an anisotropic conductive film (ACF) is used to mount the blue LED chips 108 on the submount 160.

The LED assembly 100b in FIGS. 7A, 7B, 8A, 8B, and 9 could enjoy the same advantages as the LED assembly 100a in FIGS. 2A, 2B, 3A, 3B, and 6 does. For instance, the solder joints 190 alone can fix the end 114 of the LED assembly 100b onto a printed circuit board and also deliver electric power from the printed circuit board to the LED assembly 100b. The bottom surface 104 of the LED assembly 100b has only large patterns and could be immune from scratch damage, resulting in considerable yield improvement. The blue LED chips 108 in the LED assembly 100b are enclosed by a transparent material with phosphor, so as to prevent blue light leakage. An omnidirectional lighting apparatus using the LED assembly 100b as its lighting sources could replace a conventional incandescent lamp.

Figure 8C:
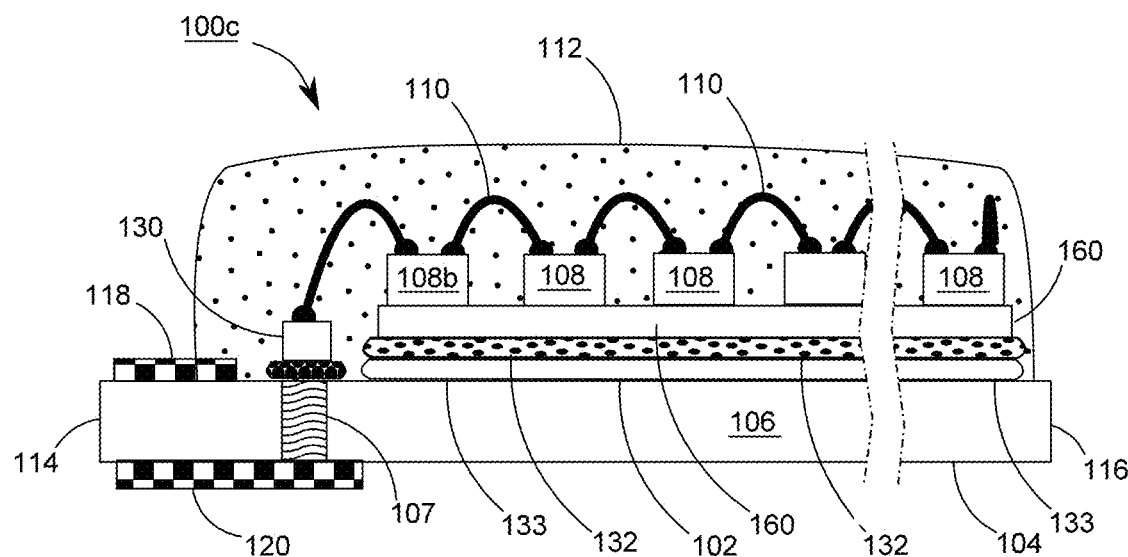
FIGS. 8C and 8D show two cross-sectional views of an LED assembly.
Figure 8D:
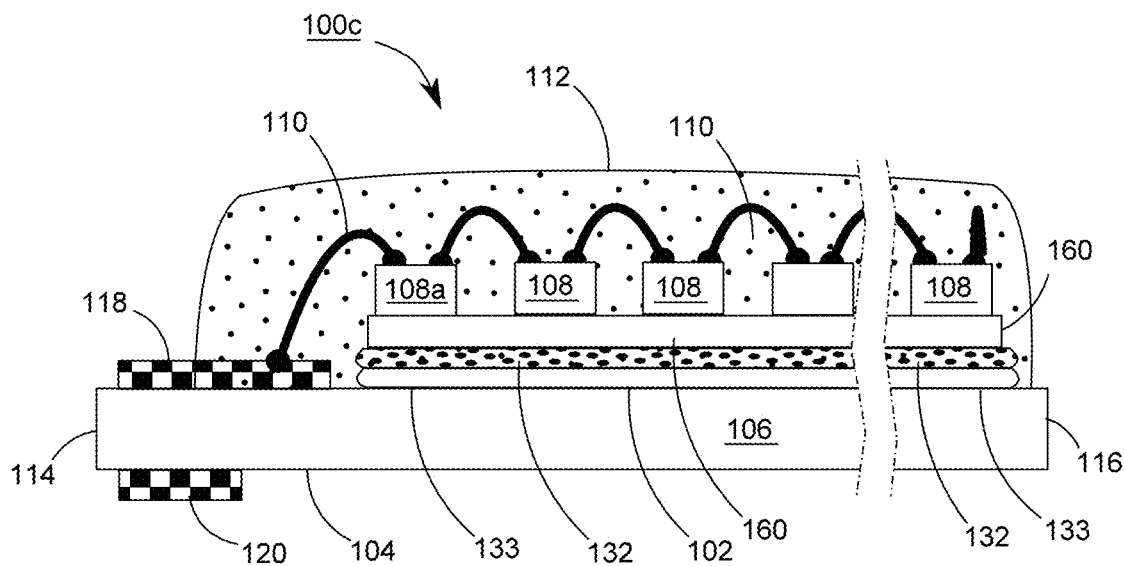

FIGS. 8C and 8D are two cross-sectional views of a LED assembly 100c, alternatives to FIGS. 8A and 8B respectively. Unlike the LED assembly 100b in FIGS. 8A and 8B, where a single transparent adhesive layer 132 mounts the submount 160 on the transparent substrate 106, the LED assembly 100c in FIGS. 8C and 8D uses two transparent adhesive layers 132 and 133 for mounting the submount 160 on the transparent substrate 106, and at least one of the transparent adhesive layers 132 and 133 has phosphor. In FIGS. 8C and 8D, the transparent adhesive layer 132 has phosphor, and the transparent adhesive layer 133 does not. The transparent adhesive layer 133 could be epoxy resin or silicone. As the transparent adhesive layer 133 has no phosphor, it could provide better adhesion to stick on the transparent substrate 106. The transparent adhesive layers 132 and 133 might have the same or different major substance. In one embodiment, another transparent adhesive layer 133 could be formed between the submount 160 and the transparent adhesive layer 132 to improve the adhesion therebetween.

Figure 10:
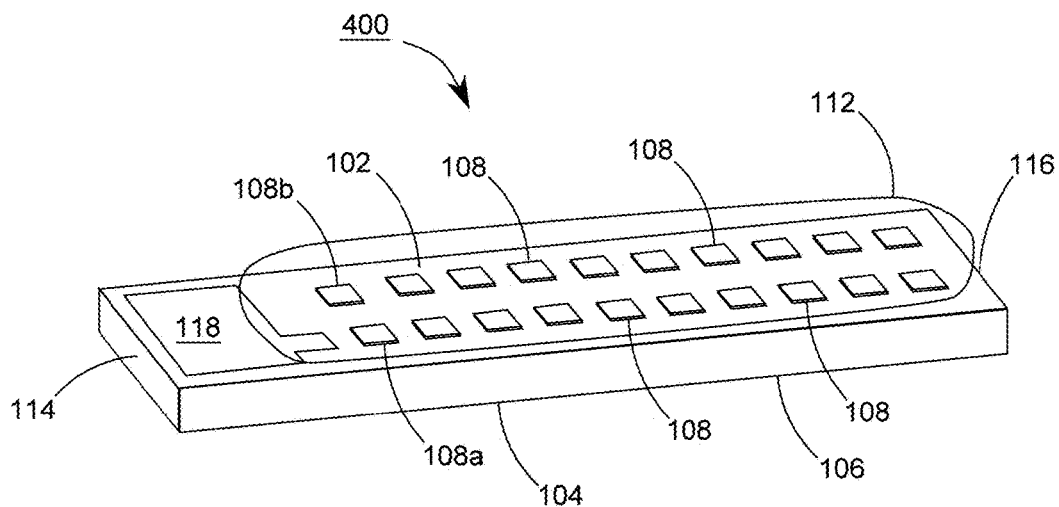
FIG. 10 is a drawing of LED assembly in one embodiment of the disclosure.
Figure 11A:
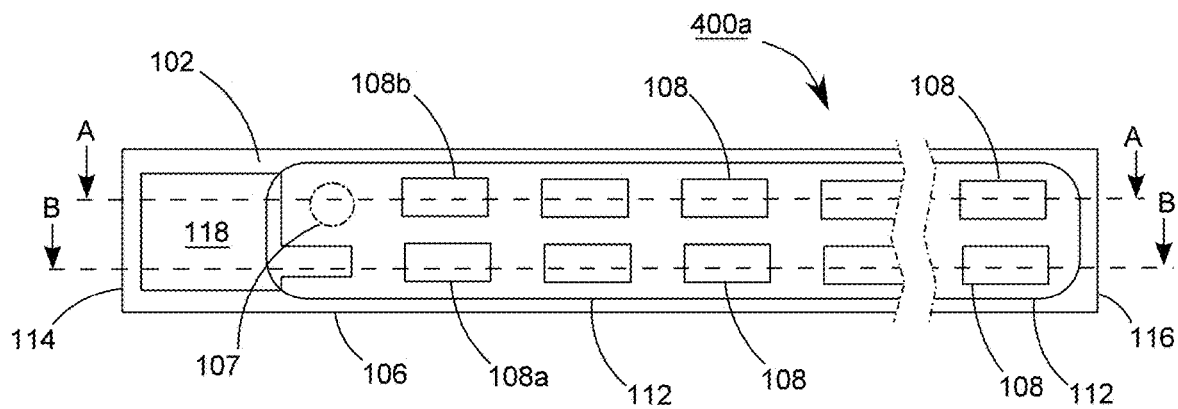
FIGS. 11A and 11B are top and bottom views of an LED assembly respectively.
Figure 11B:
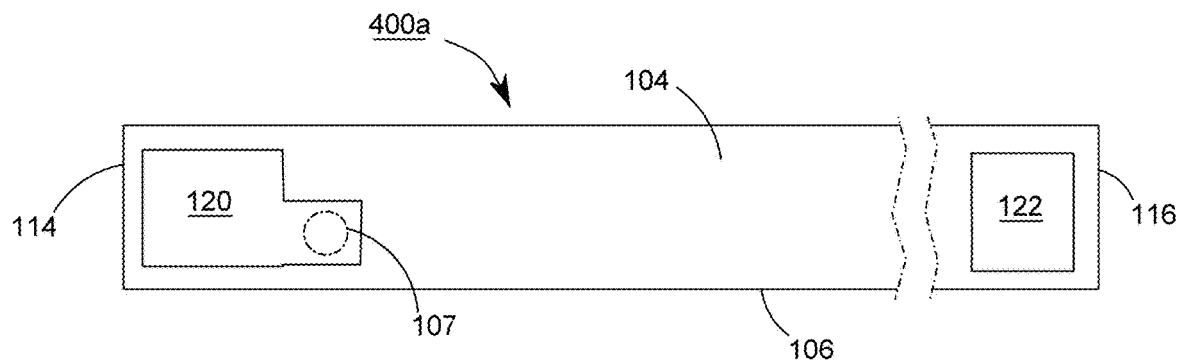

The blue LED chips in FIG. 1 employs bonding wires 110 for electric interconnection, but the disclosure is not limited to. FIG. 10 is a drawing of a LED assembly 400 in one embodiment of the disclosure, where blue LED chips 108 are mounted on the top surface 102 using a flip chip technique. FIGS. 11A and 11B are top and bottom views of the LED assembly 400a respectively, FIG. 12A demonstrates a cross-sectional view of the LED assembly 400a along line AA in FIG. 11A, and FIG. 12B demonstrates a cross-sectional view of the LED assembly 400a along line BB in FIG. 11A. FIGS. 10, 11A, 11B, 12A, and 12B correspond to FIGS. 1, 2A, 2B, 3A, and 3B, respectively, where devices or elements with similar or the same symbols refer to those with the same or similar functions and could be omitted in the following explanation for brevity.

Figure 12A:
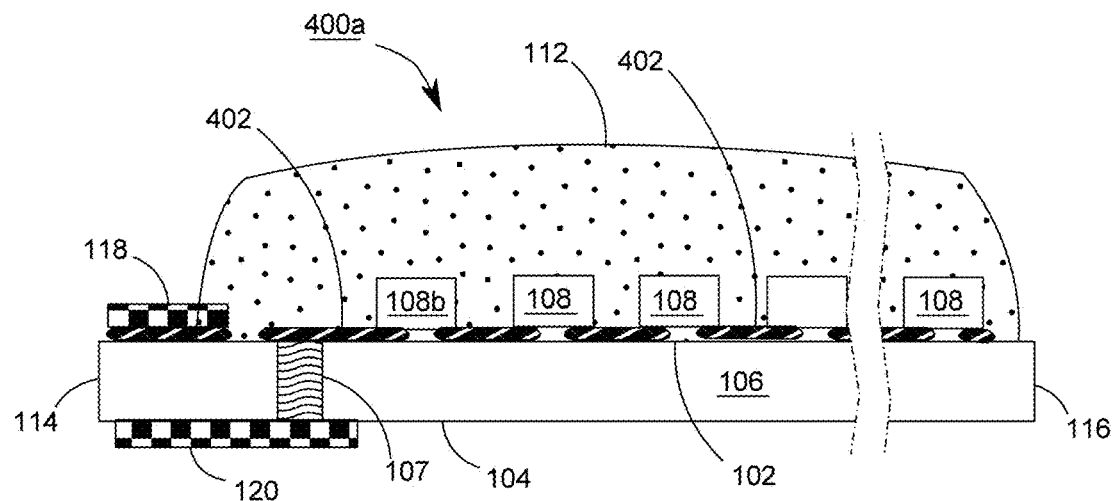
FIG. 12A demonstrates a cross-sectional view of the LED assembly along line AA in FIG. 11A.
Figure 12B:
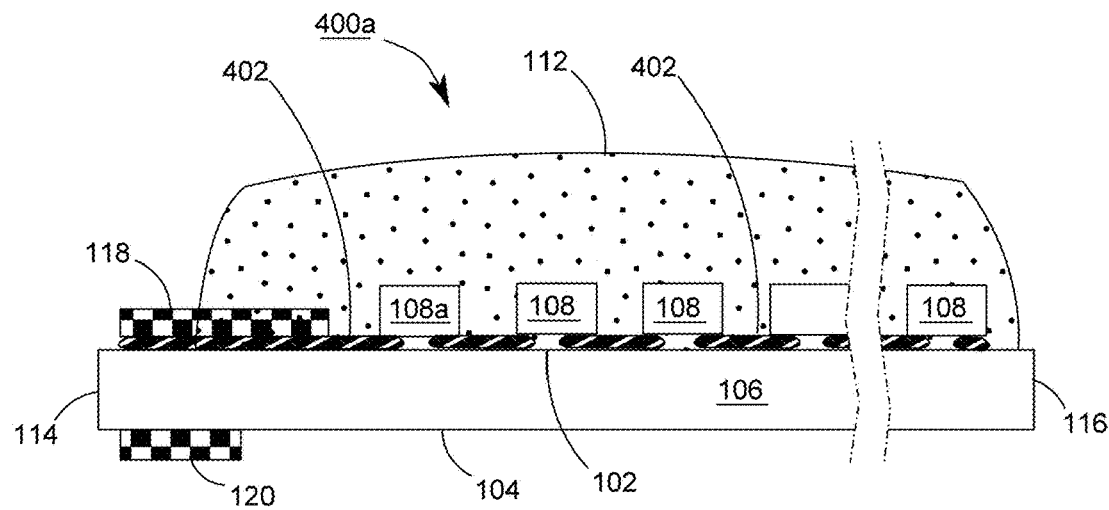
FIG. 12B demonstrates a cross-sectional view of the LED assembly along line BB in FIG. 11A.
Figure 12C:
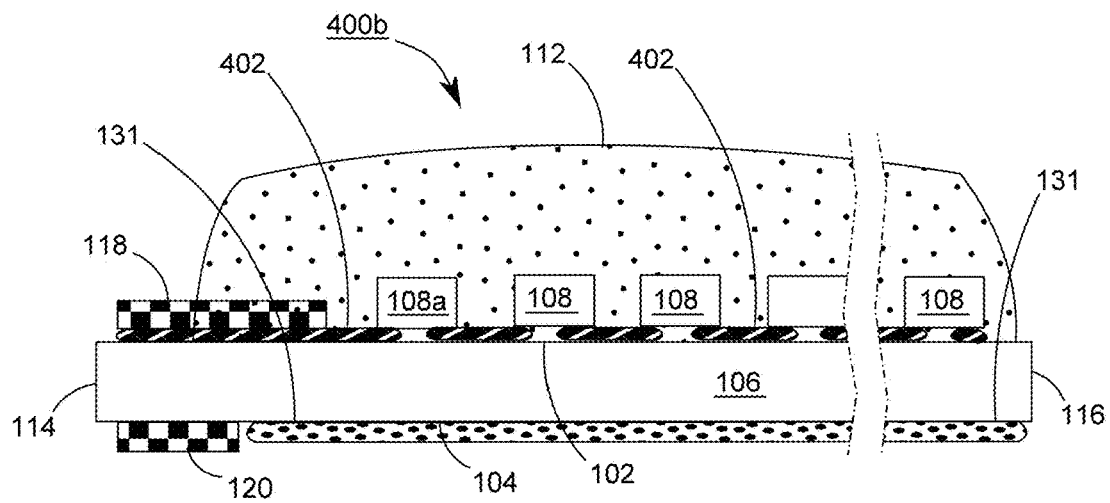
FIG. 12C shows another LED assembly 400b.

Unlike FIGS. 3A and 3B, which use bonding wires 110 for interconnection, FIGS. 12A and 12B have electrically-conductive strips 402 printed on the top surface 102 of the transparent substrate 106 and these strips 402 connects blue LED chips 108 to each other. As the blue LED chips 108 in FIGS. 12A and 12B haves omnidirectional light fields, the LED assembly 400b could be used as a light source for an omnidirectional lighting apparatus. FIG. 12C shows another LED assembly 400b, which has an additional phosphor layer 131 coated or attached on the bottom surface 104 of the transparent substrate 106. Phosphor layer 131 can convert the blue light from blue LED chips 108 into light with a different color, so as to reduce the possibility of blue light leakage from the bottom surface 104. In one embodiment, all blue LED chips 108 in the LED assembly 400a are replaced by white LED chips, each substantially being a blue LED chip coated with a phosphor layer, and accordingly blue light leakage problem might be avoided.

Even though each of the LED assemblies 100a, 100b, 100c, and 400a has a conductive via 107, which is a part of a circuit and makes it possible that the electrode plates 120 and 118 over the top and bottom surfaces (102 and 104) act as two power input terminals for driving, but this disclosure is not limited to.

Figure 13:
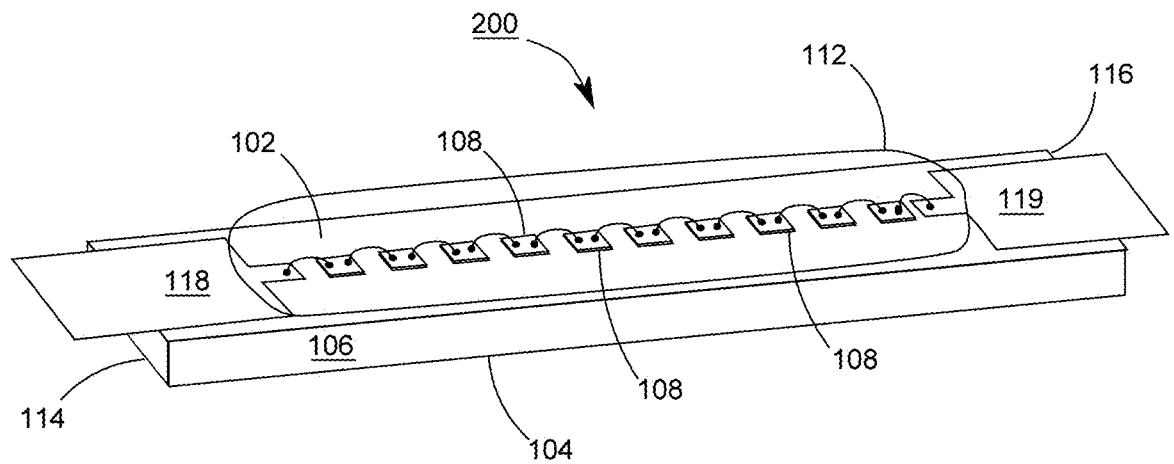
FIG. 13 is a drawing of an LED assembly in one embodiment of the disclosure.
Figure 14:
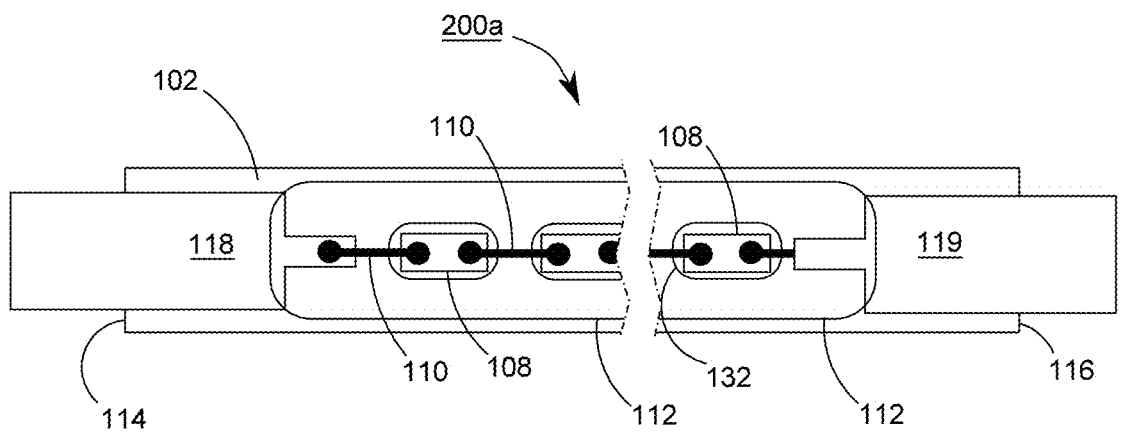
FIGS. 14 and 15 are a top view and a cross-sectional view of an LED assembly, respectively.
Figure 15:
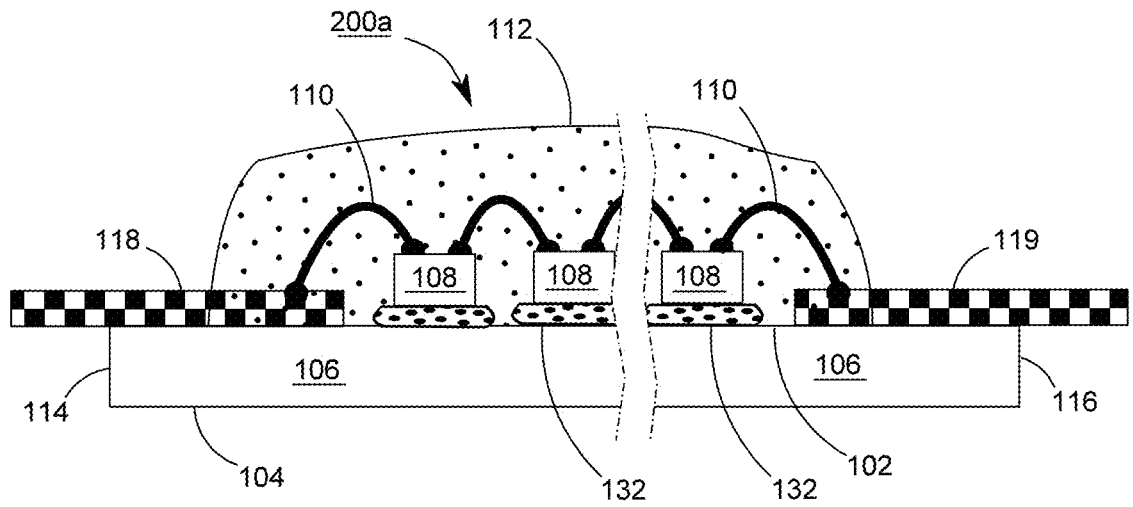

FIG. 13 is a drawing of a LED assembly 200 in one embodiment of the disclosure. FIGS. 14 and 15 are a top view and a cross-sectional view of the LED assembly 200a, respectively. Different from the LED assemblies 100a and 100b, which have no electrode plate nearby the end 116 on the top surface 102, the LED assembly 200a in FIGS. 14 and 15 has an electrode plate 119 at the end 116. The electrode plates 118 and 119 extend across the ends 114 and 116, respectively. What should be noted is that the LED assembly 200a has no conductive via 107. The way to produce the LED assemblies 200 or 200a in FIGS. 13, 14 and 15 can be derived from the aforementioned teaching and therefore is omitted herein for brevity.

In the LED assembly 200a, the blue LED chips 108 are one-on-one mounted on the transparent adhesive layers 132, but this disclosure is not limited to. In some other embodiments, some blue LED chips 108 could share one of several transparent adhesive layers 132 to mount on the transparent substrate 106. Alternatively, all blue LED chips 108 might have only one single transparent adhesive layers 132 to mount on the transparent substrate 106 in another embodiment.

Figure 16:
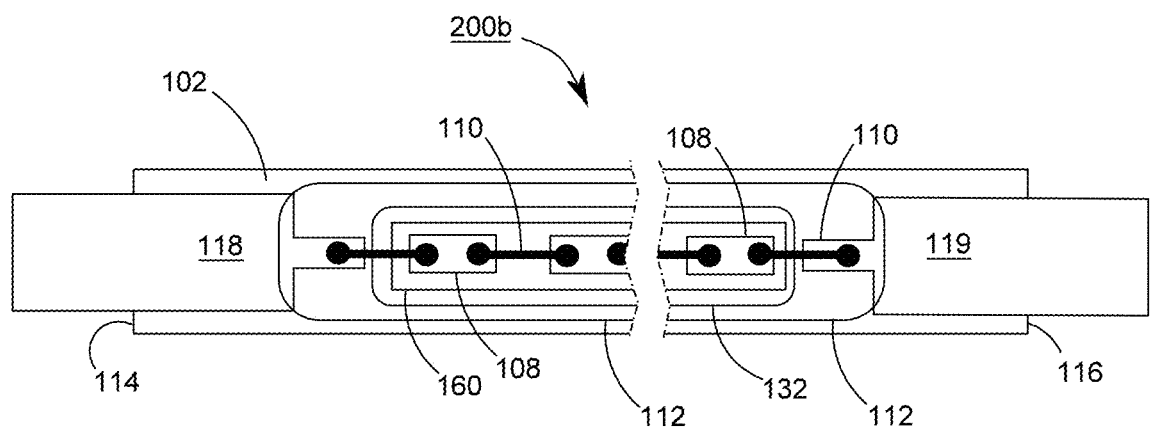
FIGS. 16 and 17 are a top view and a cross-sectional view of an LED assembly, respectively.
Figure 17:
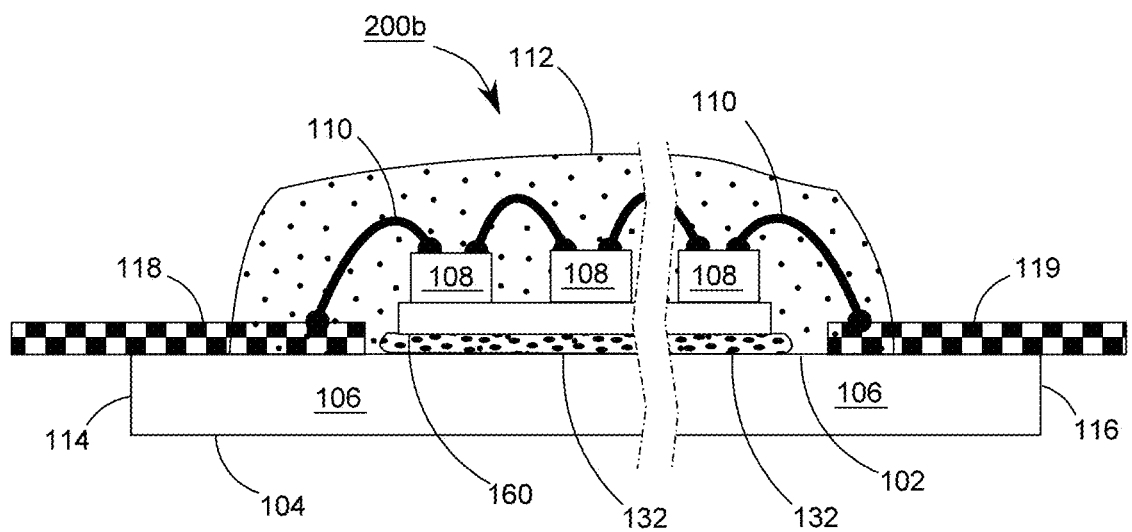

FIGS. 16 and 17, similar with FIGS. 14 and 15, are a top view and a cross-sectional view of the LED assembly 200b, respectively. FIGS. 16 and 17 have nevertheless a submount 160, which carries the blue LED chips 108 mounted thereabove and fix on to the transparent substrate 106 via the transparent adhesive layer 132. Detail of the LED assembly 200b is omitted herein and could be derived from the teaching in reference to the LED assembly 100b in FIGS. 8A and 8B.

Figure 18:
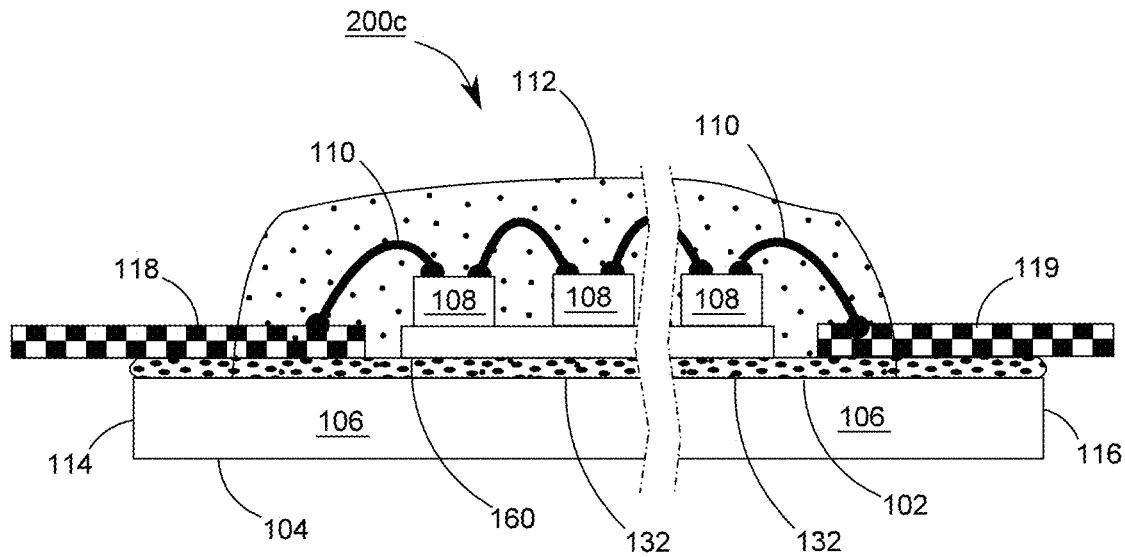
FIG. 18 is a cross-sectional view of an LED assembly and FIG. 19 demonstrates a method for manufacturing it.
Figure 19:
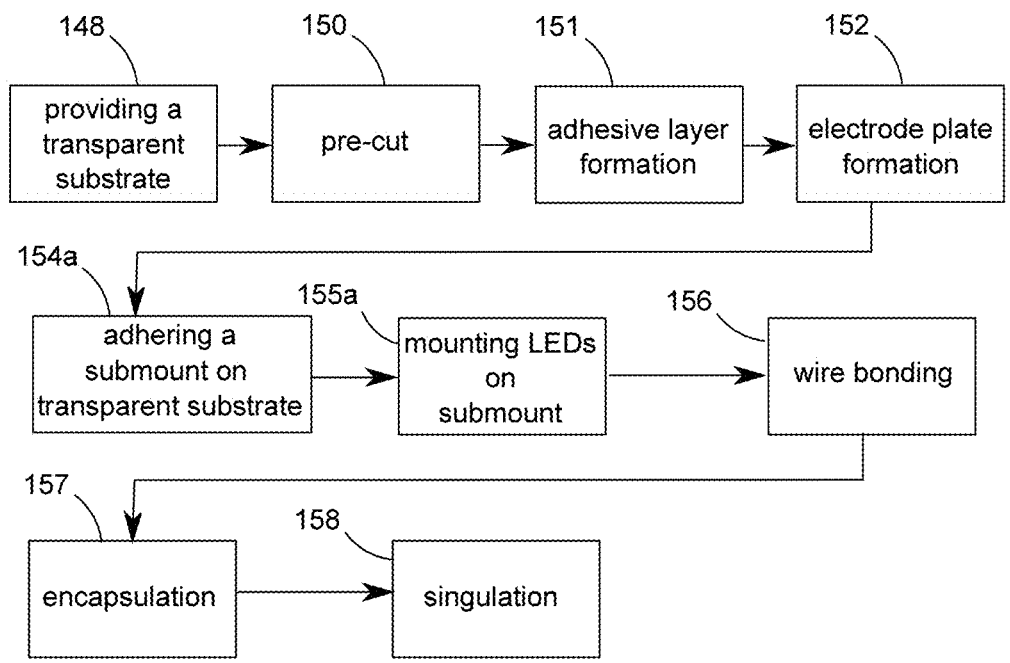

FIG. 18 is a cross-sectional view of a LED assembly 200c and FIG. 19 demonstrates a method for manufacturing it. The top view of the LED assembly 200c could be similar with FIG. 16, while FIGS. 18 and 19 are similar to FIGS. 17 and 9, respectively. Different from FIG. 17, where the electrode plates 118 and 119 directly attach on the transparent substrate 106, FIG. 18 has the transparent adhesive layer 132 to provide adhesion between the transparent substrate 106 and each of the electrode plates 118 and 119. In FIG. 19, in step 151, the transparent adhesive layer 132 forming on the transparent substrate 106 is inserted between steps 150 and 152. In other words, formation of the transparent adhesive layer 132 could be prior to attaching the electrode plates 118 and 119 on to the transparent substrate 106. The transparent adhesive layer 132 is epoxy resin or silicone, for example, in which phosphor is dispersed. The phosphor in the transparent adhesive layer 132 could be the same with or similar to that in the transparent body 112. For example, the phosphor is YAG or TAG.

One single transparent adhesive layer 132 is used to mount the submount 160 on the transparent substrate 106 in the LED assemblies 200b and 200c of FIGS. 17 and 18, but this disclosure is not limited to. Alteration could be introduced to the LED assemblies 200b and 200c, to have both the transparent adhesive layers 132 and 133 (of FIGS. 8C and 8D) between the submount 160 and the transparent substrate 106. In another embodiment, the transparent adhesive layer 133 without phosphor could be positioned between the submount 160 and transparent adhesive layer 132 to enhance adhesion therebetween.

The LED assembly 200a, 200b, or 200c has no patterns on the bottom surface 104, which accordingly does not care any scratches thereon. The LED assemblies 200a, 200b, and 200c all are suitable for omnidirectional lighting applications and possibly free from blue light leakage. For instance, a bulb according to an embodiment of the disclosure can use solder joints or electrically-conductive clamps to fix and power the electrode plates 118 and 119 respectively nearby two ends 114 and 116.

Figure 20:
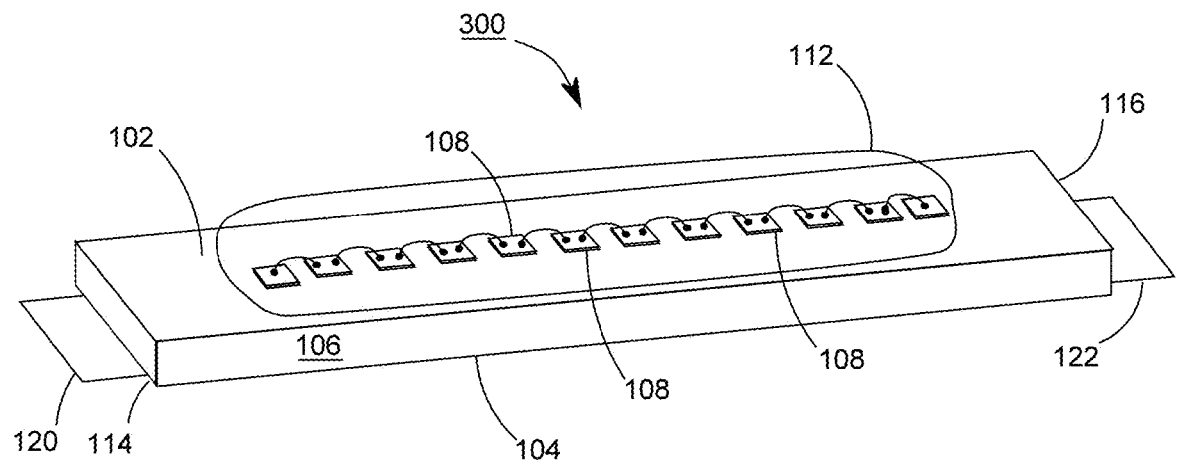
FIG. 20 is a pictorial drawing of an LED assembly.
Figure 21A:
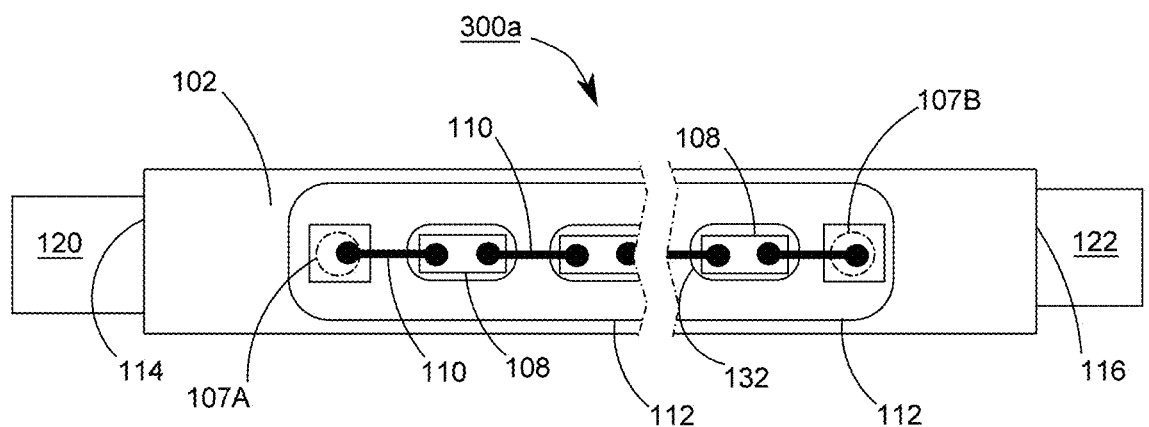
FIGS. 21A and 21B are a top view and a cross-sectional view of an LED assembly, respectively.
Figure 21B:
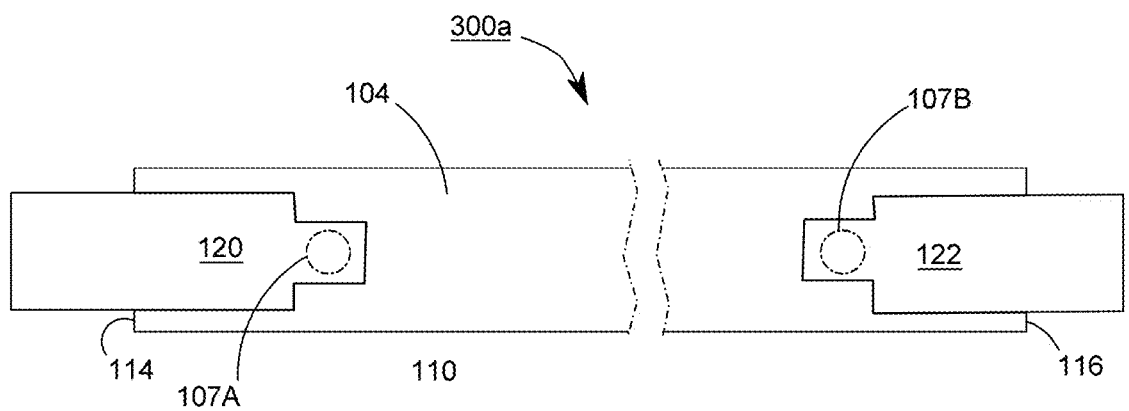
Figure 22:
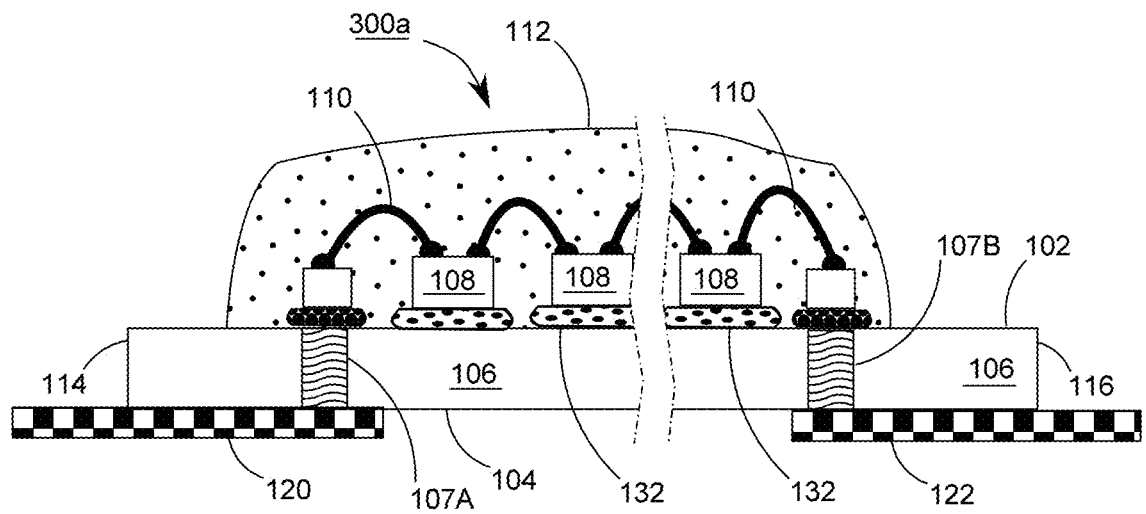
FIG. 22 demonstrates a cross-sectional view of an LED assembly.

FIG. 20 is a drawing of an LED assembly 300, and FIGS. 21A and 21B are a top view and a cross-sectional view of the LED assembly 300a, respectively. FIG. 22 demonstrates a cross-sectional view of the LED assembly 300a. Formed on the bottom surface 104 of the transparent substrate 106 of the LED assembly 300a are two electrode plates 120 and 122, at two ends 114 and 116 respectively. In each of FIGS. 21A, 21B, and 22, the LED assembly 300a has two conductive vias 107A and 107B, respectively formed somewhere close to two ends 114 and 116. The electrode plate 120, as being on the bottom surface 104, uses conductive via 107A for electrically connecting to one blue LED chip 108 on the top surface 102, while the electrode plate 122 uses the conductive via 107B for electrically connecting to another blue LED chip 108. The blue LED chips 108 are electrically connected in series between the conductive vias 107A and 107B, or, in other words, between the electrode plates 120 and 122. Details of the LED assembly 300a and possible alternatives or variations thereto could be derived in reference to other embodiments disclosed in this specification and are omitted herein.

Figure 23:
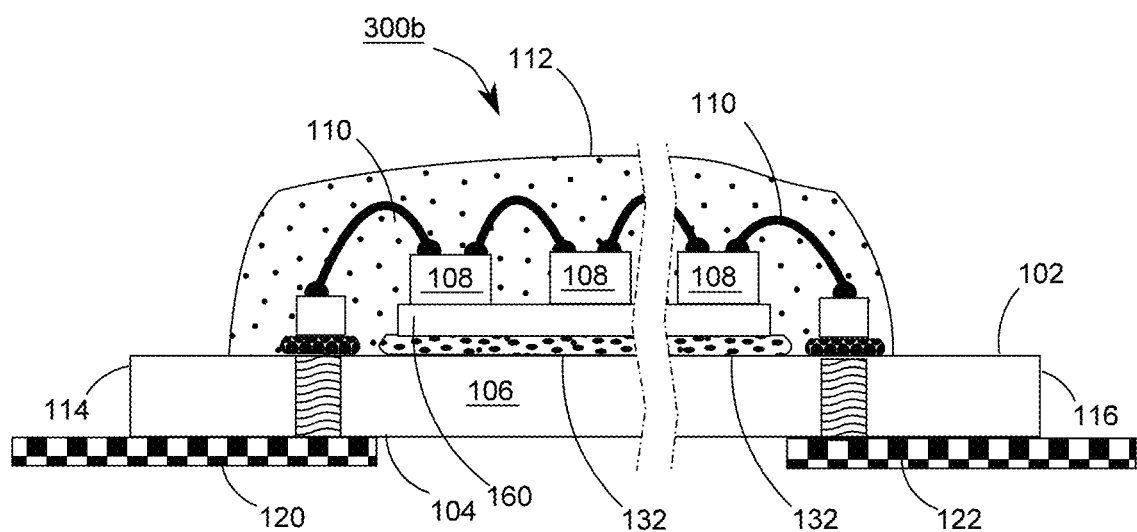
FIG. 23 demonstrates a cross-sectional view of LED assembly.

FIG. 23 demonstrates a cross-sectional view of an LED assembly 300b, where the submount 160 is placed under the blue LED chips and above the transparent adhesive layer 132. Details of the LED assembly 300b and possible alternatives or variations thereto could be derived in reference to other embodiments disclosed in this specification and are omitted herein.

Figure 24:
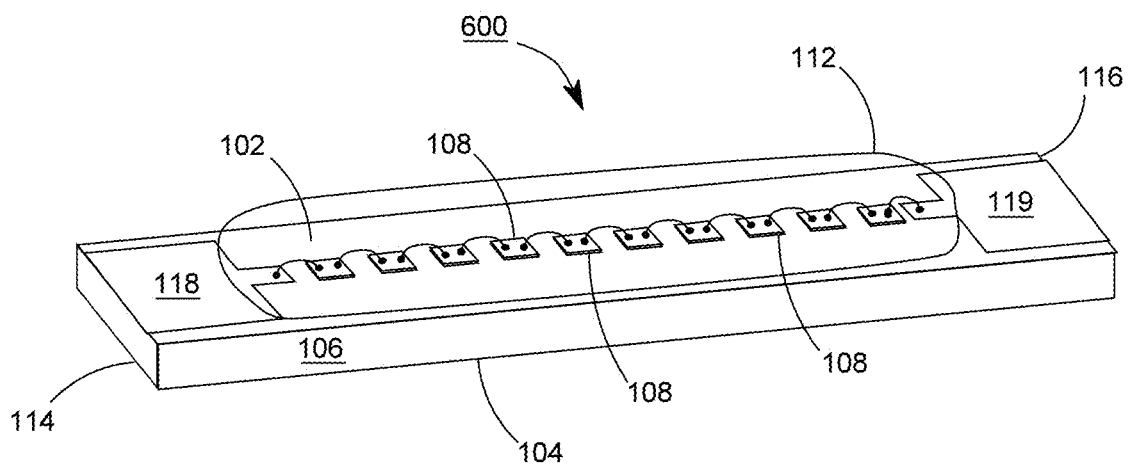
FIG. 24 is a drawing of an LED assembly.
Figure 25A:
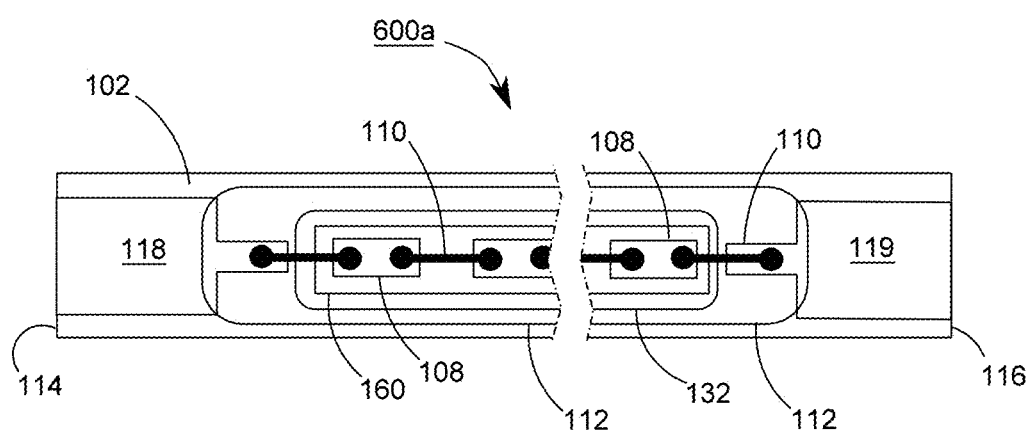
FIG. 25A shows a top view of the LED assembly.
Figure 25B:
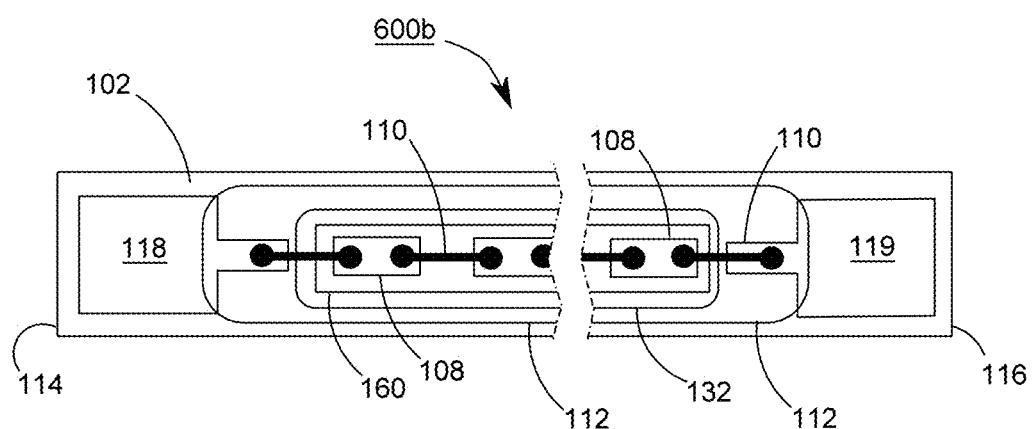
FIG. 25B shows a top view of the LED assembly.

The LED assemblies 200 and 300 both have the electrode plates extending across the ends 114 and 116, but this disclosure is not limited to. FIG. 24 is a drawing of a LED assembly 600. FIG. 25A shows the LED assembly 600a, which could be a top view of the LED assembly 600 and has the electrode plates 118 and 119, each having an edge aligned with an edge of the transparent substrate 106. FIG. 25B shows an LED assembly 600b, which could be another top view of the LED assembly 600 and has the electrode plates 118 and 119 completely inside the edges of the transparent substrate 106.

Figure 26A:
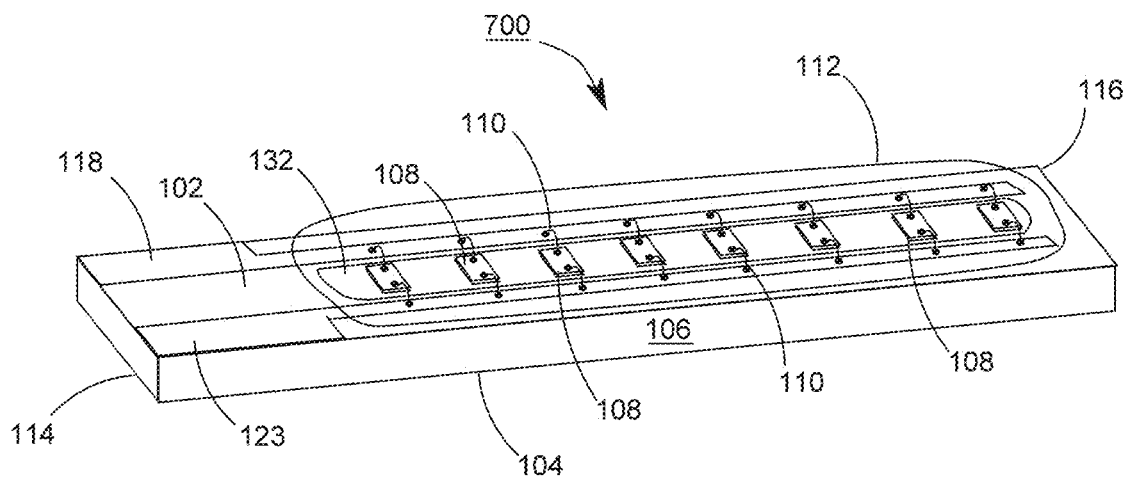
FIG. 26A is a pictorial drawing of an LED assembly in one embodiment of the disclosure.
Figure 26B:
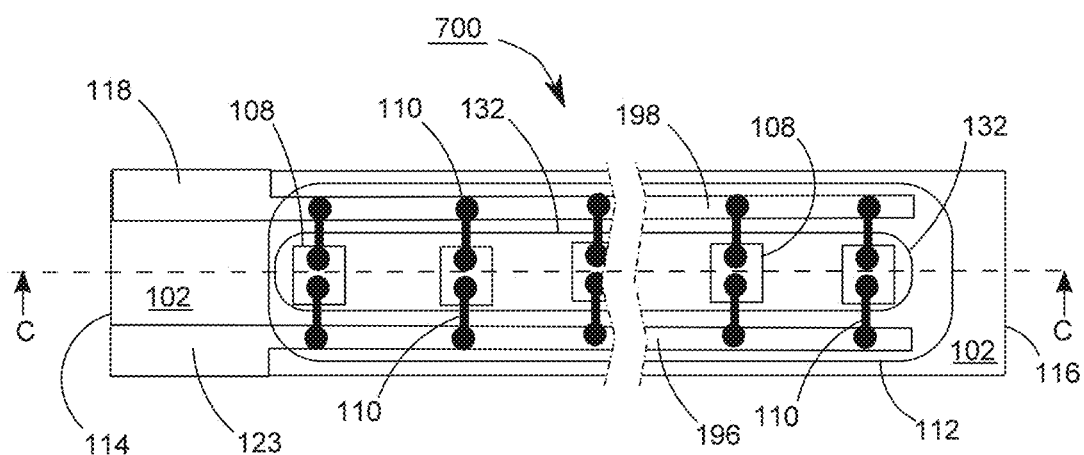
FIGS. 26B and 26C are a top view and a cross-sectional view of the LED assembly in FIG. 26A, respectively.
Figure 26C:
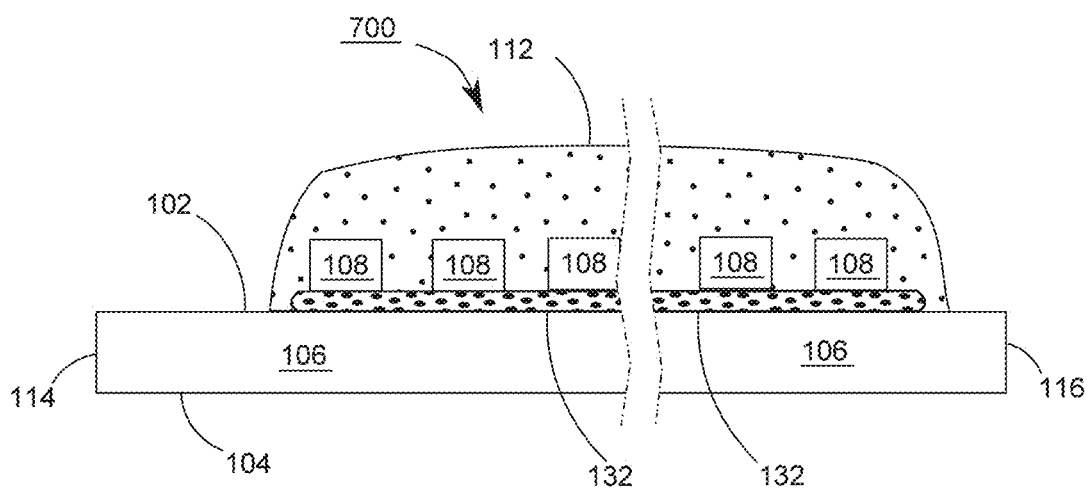

FIG. 26A is a drawing of an LED assembly 700 in one embodiment of the disclosure. FIG. 26B is a top view of the LED assembly 700. FIG. 26C is a cross-sectional view of the LED assembly 700 along line CC in FIG. 26B. The LED assembly 700 in FIGS. 26A and 26B has both electrode plates 118 and 123 on the top surface 102 at the end 114, and has nothing on the bottom surface 104 of the transparent substrate 106. Extending from the electrode plates 118 and 123 toward the end 116 are conductive strips 198 and 196. Blue LED chips 108 are mounted on the top surface 102 and between the conductive strips 198 and 196. The cathode and anode of each blue LED chip 108 are electrically connected to the conductive strips 198 and 196 with bonding wires 110. Accordingly, the blue LED chips 108 in FIGS. 26A, 26B and 26C are connected in parallel between the electrode plates 118 and 123, which therefore acts as two power input nodes for the LED assembly 700. In one embodiment, the blue LED chips 108 can be electrically connected to the conductive strips 198 and 196 by way of flip chip technique, that is, the blue LED chips 108 are electrically connected to the conductive strips 198 and 196 without using the bonding wires 110. As shown in FIG. 26C, the blue LED chips 108 are substantially encapsulated by the transparent adhesive layer 132 and the transparent body 112, both having at least one kind of phosphor dispersed therein. In one embodiment, the blue LED chips 108 are totally enclosed by the transparent adhesive layer 132 and the transparent body 112, however, the bonding wires 110 could be still exposed from the transparent adhesive layer 132 and the transparent body 112. In one embodiment, the transparent body 112 comprises two kinds of phosphors dispersed therein. One of the phosphors is capable of converting portion of the blue light (having a peak wavelength about 430 nm to 480 nm) from blue LED chips 108 into yellow light or yellowish green light or green light (having a peak wavelength from about 520 nm to 590 nm) and the other of the phosphors is capable of converting portion of the blue light from blue LED chips 108 into red light (having a peak wavelength from about 610 nm to 680 nm). The phosphor emitting yellow light or yellowish green light or green light comprises aluminum oxide (such as YAG or TAG), silicate, vanadate, alkaline-earth metal selenide, or metal nitride. The phosphor emitting red light comprises silicate, vanadate, alkaline-earth metal sulfide, metal nitride oxide, a mixture of tungstate and molybdate. The method to produce the LED assembly 700 in FIG. 26A, 26B, or 26C can be derived from the aforementioned teaching and therefore is omitted herein for brevity.

Alteration could be made to the LED assembly 700 in light of the disclosed embodiments according to the disclosure. For example, the blue LED chips 108 could be mounted on a submount, which adheres to the transparent substrate 106 via at least one transparent adhesive layer with or without a phosphor dispersed therein.

Figure 27A:
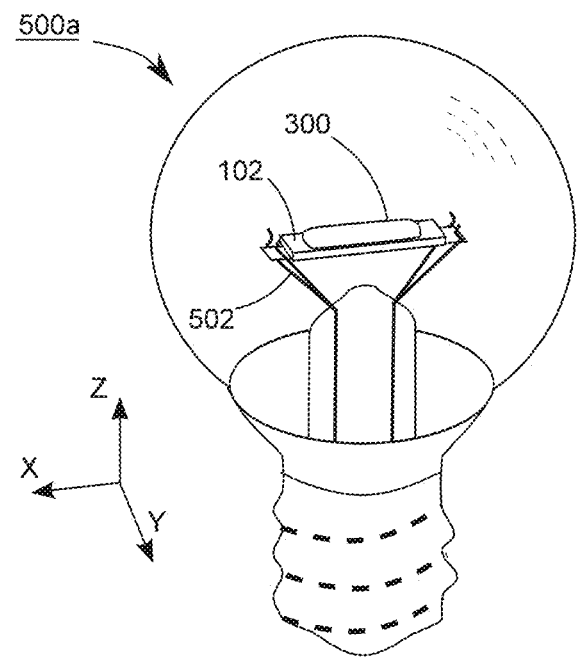
FIG. 27A illustrates an LED lamp using LED assembly as its filament.
Figure 27B:
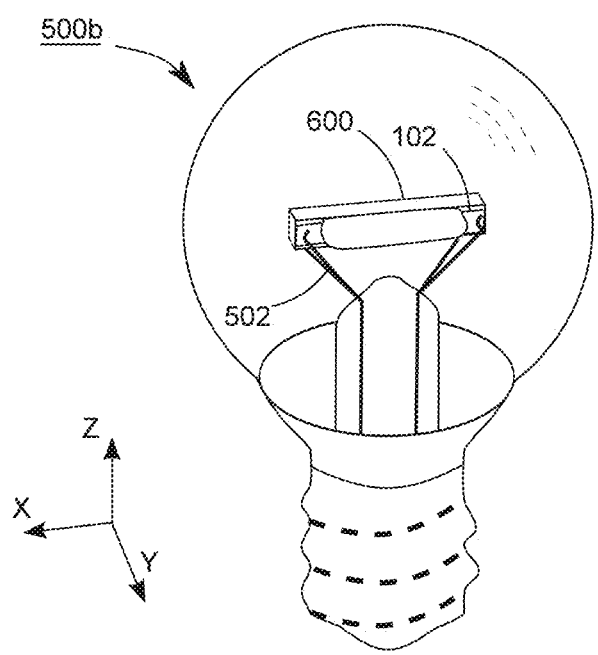
FIG. 27B illustrates an LED lamp using LED assembly as its filament.

FIG. 27A illustrates an LED lamp 500a using only one LED assembly 300 as its filament. The LED lamp 500a has two clamps 502, and each clamp 502 is in a shape of V or Y. In another embodiment, each clamp 502 could be substantially rectangular in shape, but has a notch in one of its edges for fixing the LED assembly 300 thereon. Two jaws of each clamps 502 vise one electrode plate at one end of the LED assembly 300, making the top surface 102 of the transparent substrate 106 in the LED assembly 300 face upward (the direction Z shown in FIG. 27A). Preferably, clamps 502 are made of electrically-conductive material, so as to electrically connect the electrode plates in the LED assembly 300 to the Edison screw base of the LED assembly 500a, which could drain electric power from an Edison socket to power the LED assembly 300. FIG. 27B is similar with FIG. 27A, but the LED lamp 500b in FIG. 27B uses one LED assembly 600 as its filament. Different from the LED lamp 500a which has the LED assembly 300 facing upward, the LED assembly 600 in the LED lamp 500b has its top surface 102 facing the direction Y, which is vertical to the axis (Z axis) of the LED lamp 500b. Any of the assemblies 300 and 600 in FIGS. 27A and 27B could be replaced by the LED assembly 200, details or alternatives of which could be derived in reference to the teaching disclosed in this specification and are omitted herein.

The bottom surface 104 of the LED assembly 300a or 300b has only the electrode plates 120 and 122 occupied in a large area, which is immune to casual scratches, such that yield improvement is expectable. Each of the LED assemblies 600a and 600b has no pattern on its bottom surface 104, and therefore scratches on the bottom surface 104 could not impact the yield of LED assemblies 600a and 600b. Each of the LED assemblies 300a, 300b, 600a, and 600b could be suitable for applications to generate an omnidirectional light field, and could prevent any blue light leakage.

The aforementioned embodiments all employ only blue LED chips as their lighting resource, but this disclosure is not limited to. In some embodiments, some or all blue LED chips are replaced with red or green LED chips, for example.

Because of the transparency provided by the transparent substrate 106 and the transparent adhesive layer 132, the LED assemblies in some embodiments could have an omnidirectional light field and be suitable for applications to generate an omnidirectional light field. The blue LED chips 108 in some embodiments are substantially encapsulated by the transparent adhesive layer 132 and transparent body 112 with phosphor, to avoid blue light leakage. One embodiment of the disclosure has a LED assembly with only one end fixed on a circuit board to provide both electric power and mechanic support. Nevertheless, a LED assembly of another embodiment has two ends, both fixed for mechanic support and coupled for receiving electric power from a power source. An LED assembly according to some embodiments has no fine patterns on its bottom surface, immune to scratch damage and convenient for the LED assembly transportation.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode assembly, comprising:
a circuit board;
a clamp associated with the circuit board;
a first substrate, connected to the circuit board through the clamp, and comprising a first top surface and a first bottom surface, and the first top surface including a longer edge and a shorter edge;
a first plurality of light-emitting diode chips, formed on the first top surface, and arranged along the longer edge;
a first bonding wire, electrically connecting two adjacent chips of the first plurality of light-emitting diode chips;
a transparent capsule, formed on the first top surface, and fully covering the first plurality of light-emitting diode chips and the first bonding wire without covering the first bottom surface;
a first electrode plate and a second electrode plate, formed on the first top surface, and electrically connected to the first plurality of light-emitting diode chips, the first electrode plate comprising a first bonding portion and a first extending portion, the second electrode plate comprising a second bonding portion and a second extending portion;
a second substrate comprising a second top surface and a second bottom surface; and
a second plurality of light-emitting diode chips formed on the second top surface,
wherein the first bonding portion and the second bonding portion are arranged on a same end of the top surface, the first extending portion and the second extending portion are extended along the longer edge, and
wherein the first bottom surface and the second bottom surface are faced to each other and located at opposite sides of a central axis of the light-emitting diode assembly in a perspective view.

2. The light-emitting diode assembly of claim 1, wherein the transparent capsule has a transparent body and a first phosphor dispersed in the transparent body, the transparent capsule is arranged to cover the first plurality of light-emitting diode chips.

3. The light emitting diode assembly of claim 2, further comprising a second phosphor formed on the first top surface.

4. The light-emitting diode assembly of claim 1, wherein the first extending portion is smaller than the first bonding portion in width which is parallel to the shorter edge.

5. The light-emitting diode assembly of claim 1, further comprising a second bonding wire connecting one light-emitting diode chip in the first plurality of light-emitting diode chips and the first extending portion.

6. The light-emitting diode assembly of claim 1, wherein the transparent capsule exposes two opposite ends of the first substrate.

7. The light-emitting diode assembly of claim 1, wherein the clamp has a metal jaw to grasp the first electrode plate and the second electrode plate.

8. The light emitting diode assembly of claim 7, wherein the metal jaw provides electric power for driving the first plurality of light-emitting diode chips.

9. The light-emitting diode assembly of claim 1, wherein the first substrate stands on only one end thereof.

10. The light emitting diode assembly of claim 1, further comprising an adhesive layer formed between the first plurality of light-emitting diode chips and the first substrate.

11. The light emitting diode assembly of claim 10, wherein the adhesive layer is not directly connected to the first electrode plate.

12. The light emitting diode assembly of claim 1, wherein the first bottom surface is devoid of any light-emitting diode chip.

13. The light emitting diode assembly of claim 1, wherein the first substrate comprises a side surface arranged between the first top surface and the first bottom surface, the side surface is not directly covered by the transparent capsule.

14. A light bulb, comprising:
a light-emitting diode assembly of claim 1;
a lamp shell, covering the light-emitting diode assembly; and
an electrical connection structure, associated with the lamp shell.

* * * * *